United States Patent
Wu et al.

(10) Patent No.: US 11,018,819 B2
(45) Date of Patent: *May 25, 2021

(54) METHOD AND DEVICE IN UE AND BASE STATION USED FOR WIRELESS COMMUNICATION

(71) Applicant: SHANGHAI LANGBO COMMUNICATION TECHNOLOGY COMPANY LIMITED, Shanghai (CN)

(72) Inventors: KeYing Wu, Shanghai (CN); XiaoBo Zhang, Shanghai (CN); Lin Yang, Shanghai (CN)

(73) Assignee: SHANGHAI LANGBO COMMUNICATION TECHNOLOGY COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/595,495

(22) Filed: Oct. 8, 2019

(65) Prior Publication Data
US 2020/0119872 A1    Apr. 16, 2020

(30) Foreign Application Priority Data
Oct. 10, 2018 (CN) .......................... 201811175420.8

(51) Int. Cl.
H04L 5/00 (2006.01)
H04W 24/08 (2009.01)
H03M 13/13 (2006.01)
H04W 72/04 (2009.01)

(52) U.S. Cl.
CPC .......... H04L 5/0046 (2013.01); H03M 13/13 (2013.01); H04L 5/0094 (2013.01); H04W 24/08 (2013.01); H04W 72/0446 (2013.01); H04W 72/0453 (2013.01)

(58) Field of Classification Search
USPC ........................................................ 370/329
See application file for complete search history.

(56) References Cited

U.S. PATENT DOCUMENTS

| 10,361,825 | B2 * | 7/2019 | Au | H04L 5/0007 |
| 2016/0381589 | A1 * | 12/2016 | Zhang | H04L 5/001 370/252 |
| 2017/0202021 | A1 * | 7/2017 | Lee | H04L 25/0226 |

(Continued)

Primary Examiner — Jamaal Henson
(74) Attorney, Agent, or Firm — Maschoff Brennan

(57) ABSTRACT

A method and a device for wireless communication in a User Equipment (UE) and a base station are disclosed in the present disclosure. The UE performs K channel listenings respectively in K frequency sub-bands; determines that a first radio signal can only be transmitted in K1 frequency sub-band(s) of the K frequency sub-bands; and then transmits the first radio signal in the K1 frequency sub-band(s). Herein, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1.

20 Claims, 14 Drawing Sheets

(56) References Cited

U.S. PATENT DOCUMENTS

| | | | |
|---|---|---|---|
| 2017/0311327 A1* | 10/2017 | Tanaka | H04W 72/0453 |
| 2018/0007674 A1* | 1/2018 | Shimomura | H04W 56/00 |
| 2018/0331727 A1* | 11/2018 | John Wilson | H04L 5/0048 |
| 2018/0352578 A1* | 12/2018 | Zhang | H04B 17/309 |
| 2019/0141734 A1* | 5/2019 | Lei | H04W 72/1289 |
| 2019/0174542 A1* | 6/2019 | Lei | H04L 5/0053 |

* cited by examiner

METHOD AND DEVICE IN UE AND BASE STATION USED FOR WIRELESS COMMUNICATION

CROSS-REFERENCE TO RELATED APPLICATION

This application claims the priority benefit of Chinese Patent Application Serial Number 201811175420.8, filed on Oct. 10, 2018, the full disclosure of which is incorporated herein by reference.

BACKGROUND

Technical Field

The present disclosure relates to methods and devices in wireless communication systems, and in particular to a method and a device in a wireless communication system supporting data transmission on Unlicensed Spectrum.

Related Art

Application scenarios of future wireless communication systems are becoming increasingly diversified, and different application scenarios have different performance demands on systems. In order to meet different performance requirements of various application scenarios, the work item of accessing Unlicensed Spectrum of New Radio (NR) was approved at the 3rd Generation Partner Project (3GPP) Radio Access Network (RAN) #75 plenary session. And the 3GPP RAN #78 plenary session decided to support the access of Unlicensed Spectrum in NR Release 15.

In License Assisted Access (LAA) of Long Term Evolution (LTE), a transmitter (a base station or a User Equipment) first needs to perform Listen Before Talk (LBT) before transmitting data on unlicensed spectrum so as to avoid interference with other ongoing wireless transmissions on unlicensed spectrum. According to discussions at the 3GPP RANI #92bis conference, LBT is measured in 20 MHz in an NR-Unlicensed spectrum (NR-U) system.

SUMMARY

The inventors have found through researches that in an NR-U system, a time-frequency resource occupied by an uplink transmission not only is restricted by resource allocation of the system, but is under the influence of LBT. Different LBT results may cause dynamic change to available uplink time-frequency resource. Under such circumstance, how to avoid resource wastes while ensuring the reliability of uplink transmission becomes a problem in need of solving.

In view of the above problem, the present disclosure provides a solution. It should be noted that embodiments of a User Equipment (UE) in the present disclosure and characteristics of the embodiments may be applied to a base station, and vice versa. The embodiments in the present disclosure and the characteristics of the embodiments can be mutually combined if no conflict is incurred.

The present disclosure discloses a method in a UE used for wireless communication, comprising:

performing K channel listenings respectively in K frequency sub-bands;

determining that a first radio signal can only be transmitted in K1 frequency sub-band(s) out of the K frequency sub-bands; and transmitting the first radio signal on the K1 frequency sub-band(s);

herein, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the present disclosure needs to solve a problem of how to ensure reliability of uplink transmission, particularly reliability of transmission of uplink control information (UCI), and meanwhile avoid as much resource waste as possible as frequency domain resources occupied by uplink transmission vary along with the LBT results dynamically. The above method allows a UE to dynamically configure a number of bits(s) comprised in the first bit block based in a number of available frequency sub-band(s), which is the K1, thus solving the problem.

In one embodiment, the above method is characterized in that the first bit block carries UCI, the K1 frequency sub-band(s) is(are) frequency sub-band(s) determined through LBT to be capable of transmitting radio signals. The UE transmits a radio signal carrying UCI on each of the K1 frequency sub-band(s), and determines a payload of UCI according to the K1.

In one embodiment, the above method is advantageous in that the UCI transmission reliability can be guaranteed and resource waste can be avoided in the NR-U system.

In one embodiment, the above method is advantageous in that the failure to receive UCI resulted from an erroneous judgment on the K1 by the base station can be avoided.

According to one aspect of the present disclosure, wherein a number of REs occupied by any of the K1 first sub-signal(s) in time-frequency domain is unrelated to the K1.

In one embodiment, the above method is advantageous in that the complexity of reception and decoding of the first bit block by the base station is reduced, thus decreasing the chance of failed reception of the first bit block caused by erroneous judgment on the K1 by the base station.

According to one aspect of the present disclosure, wherein the number of bits comprised in the first bit block is a candidate value of M candidate values, the M is a positive integer greater than 1, the M candidate values are positive integers respectively.

According to one aspect of the present disclosure, wherein the first bit block comprises a first sub-block, the first sub-block comprises a positive integer number of bits, the first sub-block indicates the number of bits comprised in the first bit block.

In one embodiment, the above method is advantageous in that failed reception of the first bit block resulted from an erroneous judgment of the K1 by the base station can be avoided.

According to one aspect of the present disclosure, wherein a position of the first sub-block in the first bit block is determined by default.

In one embodiment, the above method is advantageous in that the failure to receive the first sub-block resulted from an erroneous judgment of the K1 by the base station can be avoided, thus streamlining the processing complexity of the base station.

According to one aspect of the present disclosure, comprising:

performing a first channel coding;

herein, the first channel coding is based on a polar code; an input to the first channel coding comprises the first bit block, an output after the first channel coding is used for generating the K1 first sub-signal(s); reliability of a sub-channel mapped by a bit in the first sub-block is greater than reliability of a sub-channel mapped by a bit in the first bit block other than the first sub-block.

In one embodiment, the above method is advantageous in that the transmission reliability of the first sub-block is enhanced, which in turn leads to an advancement in the reliability of transmission of the first bit block.

According to one aspect of the present disclosure, wherein the first radio signal comprises K1 second sub-signal(s), the K1 second sub-signal(s) is(are) respectively transmitted in the K1 frequency sub-band(s); each of the K1 second sub-signal(s) carries a second bit block, the second bit block comprises a positive integer number of bits.

According to one aspect of the present disclosure, comprising:

receiving first information;

herein, the first information is used for determining Q time windows, a time domain resource occupied by the first radio signal belongs to a first time window of the Q time windows; the Q is a positive integer greater than 1.

According to one aspect of the present disclosure, comprising:

spontaneously choosing a first time window from Q time windows.

According to one aspect of the present disclosure, comprising:

receiving a first signaling;

herein, the first signaling indicates a frequency domain resource occupied by the first radio signal.

The present disclosure discloses a method in a base station used for wireless communication, comprising:

monitoring a first radio signal respectively in K frequency sub-bands;

determining that the first radio signal only needs to be transmitted in K1 frequency sub-band(s) out of the K frequency sub-bands; and receiving the first radio signal on the K1 frequency sub-band(s);

herein, the monitoring action is used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

According to one aspect of the present disclosure, wherein a number of REs occupied by any of the K1 first sub-signal(s) in time-frequency domain is unrelated to the K1.

According to one aspect of the present disclosure, wherein the number of bits comprised in the first bit block is a candidate value of M candidate values, the M is a positive integer greater than 1, the M candidate values are positive integers respectively.

According to one aspect of the present disclosure, wherein the first bit block comprises a first sub-block, the first sub-block comprises a positive integer number of bits; the first sub-block indicates the number of bits comprised in the first bit block.

According to one aspect of the present disclosure, wherein a position of the first sub-block in the first bit block is determined by default.

According to one aspect of the present disclosure, comprising:

performing a first channel decoding;

herein, a channel coding corresponding to the first channel decoding is a first channel coding, the first channel coding is based on a polar code; an input to the first channel coding comprises the first bit block, an output after the first channel coding is used for generating the K1 first sub-signal(s); an output after the first channel decoding is used for recovering the first bit block; reliability of a sub-channel mapped by a bit in the first sub-block is greater than reliability of a sub-channel mapped by a bit in the first bit block other than the first sub-block.

According to one aspect of the present disclosure, wherein the first radio signal comprises K1 second sub-signal(s), the K1 second sub-signal(s) is(are) respectively transmitted in the K1 frequency sub-band(s); each of the K1 second sub-signal(s) carries a second bit block, the second bit block comprises a positive integer number of bits.

According to one aspect of the present disclosure, comprising:

transmitting first information;

herein, the first information is used for determining Q time windows, a time domain resource occupied by the first radio signal belongs to a first time window of the Q time windows; the Q is a positive integer greater than 1.

According to one aspect of the present disclosure, wherein the monitoring action is used for determining the first time window out of the Q time windows.

According to one aspect of the present disclosure, comprising:

transmitting a first signaling;

herein, the first signaling indicates a frequency domain resource occupied by the first radio signal.

The present disclosure discloses a UE used for wireless communication, comprising:

a first receiver, performing K channel listenings respectively in K frequency sub-bands;

a first processor, determining that a first radio signal can only be transmitted In K1 frequency sub-band(s) out of the K frequency sub-bands; and a first transmitter, transmitting the first radio signal on the K1 frequency sub-band(s);

herein, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

The present disclosure discloses a base station used for wireless communication, comprising:

a second receiver, monitoring a first radio signal respectively in K frequency sub-bands;

a second processor, determining that the first radio signal only needs to be transmitted In K1 frequency sub-band(s) out of the K frequency sub-bands; and a third receiver, receiving the first radio signal on the K1 frequency sub-band(s);

herein, the monitoring action is used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the present disclosure has the following advantages compared with conventional schemes:

When available time-frequency resource in uplink transmission varies dynamically along with LBT results in an NR-U system, the UE is allowed to dynamically adjust UCI payload according to the size of the available resource, thus ensuring the reliability of UCI transmission and avoiding resource wastes.

UCI-carrying radio signal(s) is(are) transmitted in each actually occupied frequency sub-band, so that the reliability of UCI transmission is enhanced, and any failed reception of UCI caused by a false judgment of the base station about the frequency sub-band actually occupied by uplink transmission.

Bits used to indicate the UCI payload are added into the UCI and are then mapped to a fixed position in the UCI, thereby reducing the reception and decoding complexity of the base station, and also leading to lower chance of UCI reception failure resulting from a false judgment of the base station about the frequency sub-band actually occupied by uplink transmission.

Bits used to indicate the UCI payload are mapped onto a sub-channel of a polar code with higher reliability, thereby improving the bit transmission reliability and further increasing the UCI transmission reliability.

BRIEF DESCRIPTION OF THE DRAWINGS

Other features, objects and advantages of the present disclosure will become more apparent from the detailed description of non-restrictive embodiments taken in conjunction with the following drawings.

DESCRIPTION OF THE EMBODIMENTS

Embodiment 1

Figure 1:
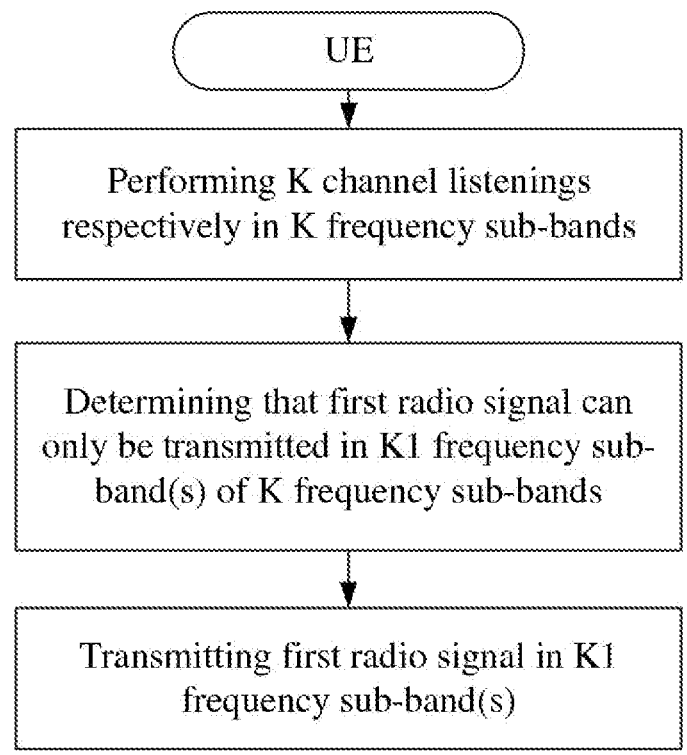
FIG. 1 illustrates a flowchart of K channel listenings and a first radio signal according to one embodiment of the present disclosure.

Embodiment 1 illustrates a flowchart of K channel listenings and a first radio signal; as shown in FIG. 1.

In Embodiment 1, the UE in the present disclosure performs K channel listenings respectively in K frequency sub-bands; determines that a first radio signal can only be transmitted In K1 frequency sub-band(s) out of the K frequency sub-bands; and transmits the first radio signal on the K1 frequency sub-band(s). Herein, the K channel listenings are used for determining the K1 frequency sub-band(s)

out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the K frequency sub-bands are all deployed on unlicensed spectrum.

In one embodiment, any of the K channel listenings is LBT.

In one embodiment, any of the K channel listenings is a Clear Channel Assessment (CCA).

In one embodiment, the specific meaning and implementation method of the CCA can be found in 3GPP TR36.889.

In one embodiment, any of the K channel listenings is realized with the method defined in 3GPP TS36.213, chapter 15.

In one embodiment, the K channel listenings are respectively used for determining whether the K frequency sub-bands are idle.

In one embodiment, the K channel listenings are respectively used for determining whether the K frequency sub-bands can be used for transmitting radio signals.

In one embodiment, the K channel listenings are respectively used for determining whether the K frequency sub-bands can be used by the UE for transmitting radio signals.

In one embodiment, the K channel listenings are respectively used for determining whether the K frequency sub-bands can be used by the UE for transmitting radio signals in a time domain resource occupied by the first radio signal.

In one embodiment, the K channel listenings are respectively used for determining whether the K frequency sub-bands can be used by the UE for transmitting the first radio signal.

In one embodiment, any of the K1 frequency sub-band(s) is determined as idle by a corresponding channel listening out of the K channel listenings.

In one embodiment, any of the K1 frequency sub-band(s) is determined as capable of transmitting radio signals by a corresponding channel listening out of the K channel listenings.

In one embodiment, any of the K1 frequency sub-band(s) is determined as able to be used by the UE for transmitting radio signals by a corresponding channel listening out of the K channel listenings.

In one embodiment, any of the K1 frequency sub-band(s) is determined as able to be used by the UE for transmitting radio signals in a time domain resource occupied by the first radio signal by a corresponding channel listening out of the K channel listenings.

In one embodiment, any of the K1 frequency sub-band(s) is determined as able to be used by the UE for transmitting the first radio signal.

In one embodiment, any of the K frequency sub-bands not belonging to the K1 frequency sub-band(s) is determined as busy by a corresponding channel listening out of the K channel listenings.

In one embodiment, any of the K frequency sub-bands not belonging to the K1 frequency sub-band(s) is determined as uncapable of transmitting radio signals by a corresponding channel listening out of the K channel listenings.

In one embodiment, any of the K frequency sub-bands not belonging to the K1 frequency sub-band(s) is determined as unable to be used by the UE for transmitting radio signals by a corresponding channel listening out of the K channel listenings.

In one embodiment, any of the K frequency sub-bands not belonging to the K1 frequency sub-band(s) is determined as unable to be used by the UE for transmitting radio signals in a time domain resource occupied by the first radio signal by a corresponding channel listening out of the K channel listenings.

In one embodiment, any of the K frequency sub-bands not belonging to the K1 frequency sub-band(s) is determined as unable to be used by the UE for transmitting the first radio signal by a corresponding channel listening out of the K channel listenings.

In one embodiment, at least one of the K frequency sub-bands not belonging to the K1 frequency sub-band(s) is determined as idle by a corresponding channel listening out of the K channel listenings.

In one embodiment, at least one of the K frequency sub-bands not belonging to the K1 frequency sub-band(s) is determined as capable of transmitting radio signals by a corresponding channel listening out of the K channel listenings.

In one embodiment, at least one of the K frequency sub-bands not belonging to the K1 frequency sub-band(s) is determined as able to be used by the UE for transmitting radio signals by a corresponding channel listening out of the K channel listenings.

In one embodiment, at least one of the K frequency sub-bands not belonging to the K1 frequency sub-band(s) is determined as able to be used by the UE for transmitting radio signals in a time domain resource occupied by the first radio signal by a corresponding channel listening out of the K channel listenings.

In one embodiment, a given frequency sub-band of the K frequency sub-bands not belonging to the K1 frequency sub-band(s) is determined as idle by a corresponding channel listening out of the K channel listenings, the given frequency sub-band and any of the K1 frequency sub-band(s) are not consecutive.

In one embodiment, the UE drops transmitting the first radio signal in any of the K frequency sub-bands not belonging to the K1 frequency sub-band(s).

In one embodiment, the UE does not transmit any radio signal in any of the K frequency sub-bands not belonging to the K1 frequency sub-band(s) within a time domain resource occupied by the first radio signal.

In one embodiment, the first radio signal comprises uplink data.

In one embodiment, the first radio signal comprises an uplink reference signal.

In one subembodiment of the above embodiment, the uplink reference signal is a DeModulation Reference Signal (DMRS).

In one embodiment, the first radio signal comprises UCI.

In one embodiment, the first radio signal comprises Autonomous UpLink (AUL)-UCI.

In one embodiment, the first bit block carries UCI.

In one embodiment, the first bit block carries AUL-UCI.

In one embodiment, the first bit block carries Hybrid Automatic Repeat reQuest-Acknowledgement (HARQ-ACK).

In one embodiment, the first bit block carries a Scheduling Request (SR).

In one embodiment, the first bit block carries a Channel-state information reference signals Resource Indicator (CRI).

In one embodiment, the first bit block carries Channel State Information (CSI).

In one subembodiment of the above embodiment, the CSI comprises one or more of a CRI, a Precoding Matrix Indicator (PMI), Reference Signal Received Power (RSRP), Reference Signal Received Quality (RSRQ) or a Channel Quality Indicator (CQI).

In one embodiment, the first bit block carries a HARQ process number.

In one embodiment, the first bit block carries first sub-information, the first sub-information indicates a HARQ process number corresponding to the first radio signal.

In one embodiment, the first bit block carries a Redundancy Version (RV).

In one embodiment, the first bit block carries second sub-information, the second sub-information indicates an RV corresponding to the first radio signal.

In one embodiment, the first bit block carries a New Data Indicator (NDI).

In one embodiment, the first bit block carries third sub-information, the third sub-information indicates an NDI corresponding to the first radio signal.

In one embodiment, the first bit block carries a UE ID.

In one embodiment, the first bit block carries fourth sub-information, the fourth sub-information indicates a UE ID corresponding to the UE.

In one embodiment, the UE ID is a Cell Radio Network Temporary Identifier (C-RNTI).

In one embodiment, the first bit block indicates a start time for a time domain resource occupied by the first radio signal.

In one embodiment, the first bit block indicates an end time for a time domain resource occupied by the first radio signal.

In one embodiment, the first bit block carries a Channel Occupancy Time (COT) Sharing indication.

In one embodiment, a transmission of the first radio signal is an uplink transmission based on configured grant.

In one embodiment, a transmission of the first radio signal is an AUL-based uplink transmission.

In one embodiment, a time-frequency resource occupied by the first radio signal belongs to AUL resources.

In one embodiment, a time-frequency resource occupied by the first radio signal is a time-frequency resource allocated to an uplink transmission based on configured grant.

In one embodiment, the phrase that each of the K1 first sub-signal(s) carries a first bit block refers to: each of the K1 first sub-signal(s) is an output after all or part of bits in the first bit block are sequentially subjected to Cyclic Redundancy Check (CRC) Attachment, Segmentation, coding block-level CRC Attachment, Channel Coding, Rate Matching, Concatenation, Scrambling, a Modulation Mapper, a Layer Mapper, a transform precoder, Precoding, a Resource Element Mapper, Multicarrier Symbol Generation, and Modulation and Upconversion.

In one embodiment, the phrase that each of the K1 first sub-signal(s) carries a first bit block refers to: each of the K1 first sub-signal(s) is an output after all or part of bits in the first bit block are sequentially subjected to CRC Attachment, Segmentation, coding block-level CRC Attachment, Channel Coding, Rate Matching, Concatenation, Scrambling, a Modulation Mapper, a Layer Mapper, Precoding, a Resource Element Mapper, Multicarrier Symbol Generation, and Modulation and Upconversion.

In one embodiment, the phrase that each of the K1 first sub-signal(s) carries a first bit block refers to: each of the K1 first sub-signal(s) is an output after all or part of bits in the first bit block are sequentially subjected to Channel Coding, Rate Matching, a Modulation Mapper, a Layer Mapper, a transform precoder, Precoding, a Resource Element Mapper, Multicarrier Symbol Generation, and Modulation and Upconversion.

In one embodiment, the phrase that each of the K1 first sub-signal(s) carries a first bit block refers to: each of the K1 first sub-signal(s) is an output after all or part of bits in the first bit block are sequentially subjected to Channel Coding, Rate Matching, a Modulation Mapper, a Layer Mapper, Precoding, a Resource Element Mapper, Multicarrier Symbol Generation, and Modulation and Upconversion.

In one embodiment, the phrase that each of the K1 first sub-signal(s) carries a first bit block refers to: the first bit block is used for generating each of the K1 first sub-signal(s).

In one embodiment, the UE repeatedly transmits the K1 first sub-signal(s) respectively on the K1 frequency sub-band(s).

In one embodiment, the number of bits comprised in the first bit block decreases as the K1 decreases.

In one embodiment, if the K1 is equal to A1, the number of bits comprised in the first bit block is equal to B1; if the K1 is equal to A2, the number of bits comprised in the first bit block is equal to B2; the A1, the A2, the B1 and the B2 are positive integers respectively; the A1 is less than the A2, and the B1 is no greater than the B2.

In one subembodiment of the above embodiment, the B1 is less than the B2.

In one subembodiment of the above embodiment, the B1 is equal to the B2.

In one embodiment, the number of bits comprised in the first bit block is related to a total number of subcarriers occupied by the first radio signal on the K1 frequency sub-band(s).

In one embodiment, the number of bits comprised in the first bit block decreases as a total number of subcarriers occupied by the first radio signal on the K1 frequency sub-band(s) decreases.

In one embodiment, if a total number of subcarriers occupied by the first radio signal on the K1 frequency sub-band(s) is equal to A3, the number of bits comprised in the first bit block is equal to B3; if a total number of subcarriers occupied by the first radio signal on the K1 frequency sub-band(s) is equal to A4, the number of bits comprised in the first bit block is equal to B4; the A3, the A4, the B3 and the B4 are positive integers respectively; the A3 is less than the A4, and the B3 is no greater than the B4.

In one subembodiment of the above embodiment, the B3 is less than the B4.

In one subembodiment of the above embodiment, the B3 is equal to the B4.

In one embodiment, the number of bits comprised in the first bit block is related to a total number of Resource Elements (REs) occupied by the first radio signal on the K1 frequency sub-band(s).

In one embodiment, the number of bits comprised in the first bit block decreases as a total number of REs occupied by the first radio signal on the K1 frequency sub-band(s) decreases.

In one embodiment, if a total number of REs occupied by the first radio signal on the K1 frequency sub-band(s) is equal to A5, the number of bits comprised in the first bit block is equal to B5; if a total number of REs occupied by the first radio signal on the K1 frequency sub-band(s) is equal to A6, the number of bits comprised in the first bit block is equal to B6; the A5, the A6, the B5 and the B6 are positive integers respectively; the A5 is less than the A6, and the B5 is no greater than the B6.

In one subembodiment of the above embodiment, the B5 is less than the B6.

In one subembodiment of the above embodiment, the B5 is equal to the B6.

In one embodiment, the first bit block is subjected to channel coding and rate matching to generate a first coding bit block, the first coding bit block is used for generating the K1 first sub-signal(s); the first coding bit block comprises a positive integer number of bits, the number of bits comprised in the first coding bit block is related to the K1.

In one subembodiment of the above embodiment, the number of bits comprised in the first coding bit block decreases as the K1 decreases.

In one subembodiment of the above embodiment, if the K1 is equal to A1, the number of bits comprised in the first coding bit block is equal to C1; if the K1 is equal to A2, the number of bits comprised in the first coding bit block is equal to C2; the A1, the A2, the C1 and the C2 are positive integers respectively; the A1 is less than the A2, and the C1 is no greater than the C2.

In one subembodiment of the above embodiment, the K1 first sub-signal(s) is(are) an output after the first coding bit block is sequentially subjected to a Modulation Mapper, a Layer Mapper, Precoding, a Resource Element Mapper, Multicarrier Symbol Generation, and Modulation and Upconversion.

In one subembodiment of the above embodiment, the K1 first sub-signal(s) is(are) an output after the first coding bit block is sequentially subjected to part or all of Concatenation, Scrambling, a Modulation Mapper, a Layer Mapper, a transform precoder, Precoding, a Resource Element Mapper, Multicarrier Symbol Generation, and Modulation and Upconversion.

In one embodiment, a relation between the number of bits comprised in the first bit block and the K1 is configured by a higher layer signaling.

In one embodiment, a relation between the number of bits comprised in the first bit block and the K1 is configured by a Radio Resource Control (RRC) signaling.

Embodiment 2

Figure 2:
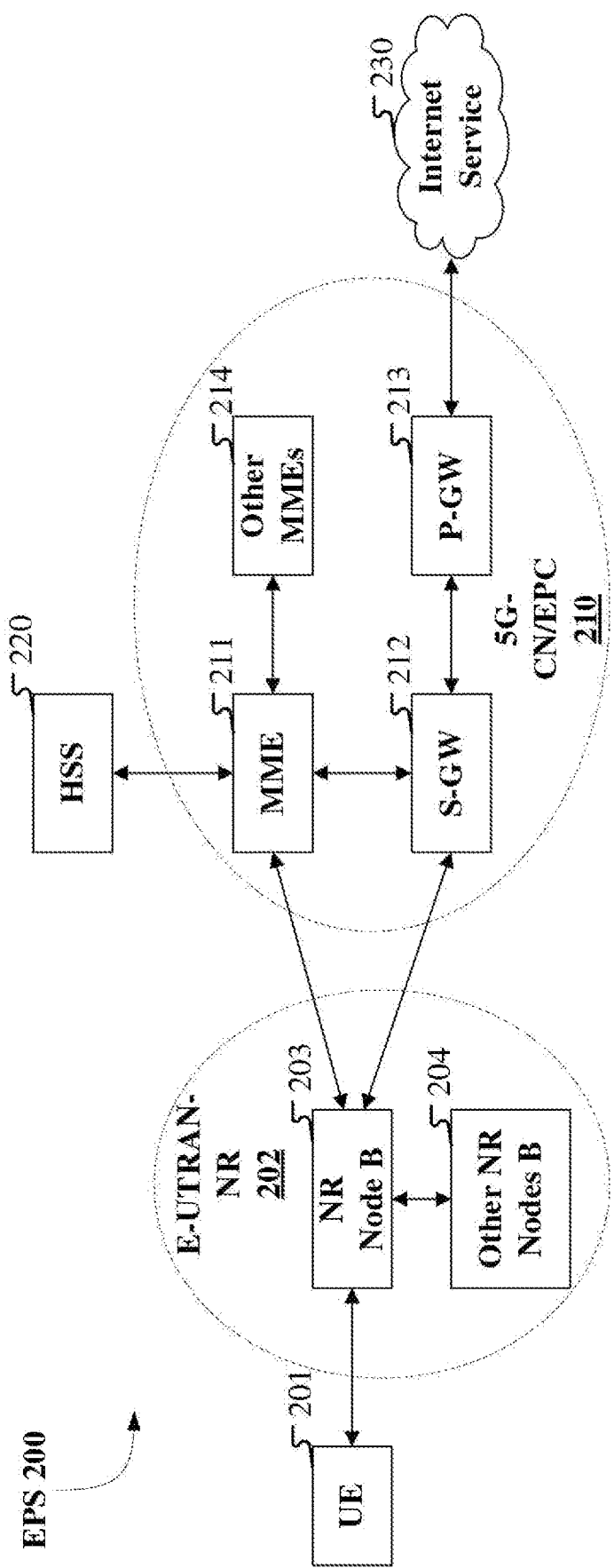
FIG. 2 illustrates a schematic diagram of a network architecture according to one embodiment of the present disclosure.

Embodiment 2 illustrates a schematic diagram of a network architecture, as shown in FIG. 2.

FIG. 2 is a diagram illustrating a network architecture 200 of Long-Term Evolution (LTE), Long-Term Evolution Advanced (LTE-A) and future 5G systems. The LTE, LTE-A or 5G network architecture 200 may be called an Evolved Packet System (EPS) 200. The EPS 200 may comprise one or more UEs 201, an E-UTRAN-NR 202, a 5G-Core Network/Evolved Packet Core (5G-CN/EPC) 210, a Home Subscriber Server (HSS) 220 and an Internet Service 230. Herein, UMTS refers to Universal Mobile Telecommunications System. The EPS 200 may be interconnected with other access networks. For simple description, the entities/interfaces are not shown. As shown in FIG. 2, the EPS 200 provides packet switching services. Those skilled in the art will find it easy to understand that various concepts presented throughout the present disclosure can be extended to networks providing circuit switching services. The E-UTRAN-NR 202 comprises an NR node B (gNB) 203 and other gNBs 204. The gNB 203 provides UE 201 oriented user plane and control plane protocol terminations. The gNB 203 may be connected to other gNBs 204 via an Xn interface (for example, backhaul). The gNB 203 may be called a base station, a base transceiver station, a radio base station, a radio transceiver, a transceiver function, a Base Service Set (BSS), an Extended Service Set (ESS), a Transmitter Receiver Point (TRP) or some other applicable terms. The gNB 203 provides an access point of the 5G-CN/EPC 210 for the UE 201. Examples of UE 201 include cellular phones, smart phones, Session Initiation Protocol (SIP) phones, laptop computers, Personal Digital Assistant (PDA), Satellite Radios, Global Positioning Systems (GPSs), multimedia devices, video devices, digital audio players (for example, MP3 players), cameras, games consoles, unmanned aerial vehicles, air vehicles, narrow-band physical network equipment, machine-type communication equipment, land vehicles, automobiles, wearable equipment, or any other devices having similar functions. Those skilled in the art also can call the UE 201 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or some other appropriate terms. The gNB 203 is connected to the 5G-CN/EPC 210 via an S1 interface. The 5G-CN/EPC 210 comprises an MME 211, other MMES 214, a Service Gateway (S-GW) 212 and a Packet Date Network Gateway (P-GW) 213. The MME 211 is a control node for processing a signaling between the UE 201 and the 5G-CN/EPC 210. Generally, the MME 211 provides bearer and connection management. All user Internet Protocol (IP) packets are transmitted through the S-GW 212, the S-GW 212 is connected to the P-GW 213. The P-GW 213 provides UE IP address allocation and other functions. The P-GW 213 is connected to the Internet Service 230. The Internet Service 230 comprises IP services corresponding to operators, specifically including Internet, Intranet, IP Multimedia Subsystem (IMS) and Packet Switching Services.

In one embodiment, the gNB 203 corresponds to the base station in the present disclosure.

In one embodiment, the UE 201 corresponds to the UE in the present disclosure.

In one embodiment, the gNB 203 supports wireless communication of data transmission on unlicensed spectrum.

In one embodiment, the UE 201 supports wireless communication of data transmission on unlicensed spectrum.

Embodiment 3

Figure 3:
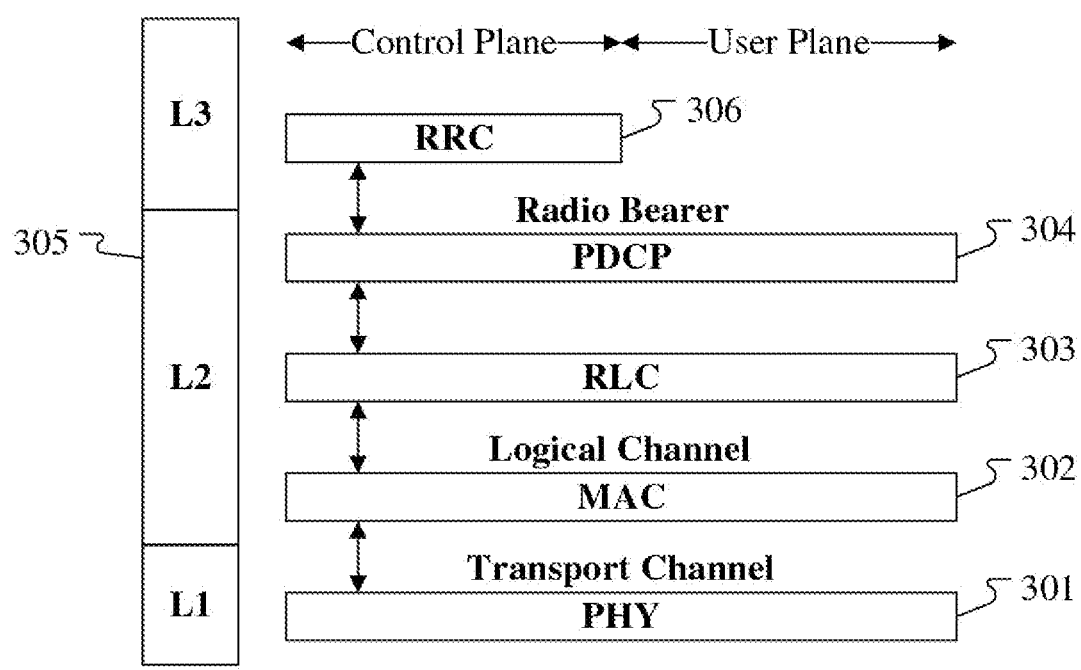
FIG. 3 illustrates a schematic diagram of a radio protocol architecture of a user plane and a control plane according to one embodiment of the present disclosure.

Embodiment 3 illustrates a schematic diagram of a radio protocol architecture of a user plane and a control plane, as shown in FIG. 3.

FIG. 3 is a schematic diagram illustrating a radio protocol architecture of a user plane and a control plane. In FIG. 3, the radio protocol architecture for a UE and a gNB is represented by three layers, which are a layer 1, a layer 2 and a layer 3, respectively. The layer 1 (L1) is the lowest layer and performs signal processing functions of various PHY layers. The L1 is called PHY 301 in the present disclosure. The layer 2 (L2) 305 is above the PHY 301, and is in charge of the link between the UE and the gNB via the PHY 301. In the user plane, L2 305 comprises a Medium Access Control (MAC) sublayer 302, a Radio Link Control (RLC) sublayer 303 and a Packet Data Convergence Protocol (PDCP) sublayer 304. All the three sublayers terminate at the gNBs of the network side. Although not described in FIG. 3, the UE may comprise several protocol layers above the L2 305, such as a network layer (i.e., IP layer) terminated at a P-GW 213 of the network side and an application layer terminated at the other side of the connection (i.e., a peer UE, a server, etc.). The PDCP sublayer 304 provides multiplexing among variable radio bearers and logical channels. The PDCP sublayer 304 also provides a header compression for a higher-layer packet so as to reduce a radio transmission overhead. The PDCP sublayer 304 provides security by encrypting a packet and provides support for UE handover between gNBs. The RLC sublayer 303 provides segmentation and reassembling of a higher-layer packet, retransmission of a lost packet, and reordering of a packet so as to compensate the disordered receiving caused by HARQ. The MAC sublayer 302 provides multiplexing between a logical channel and a transport channel. The MAC sublayer 302 is also responsible for allocating between UEs various radio resources (i.e., resource block) in a cell. The MAC sublayer 302 is also in charge of HARQ operation. In the control plane, the radio protocol architecture of the UE and the gNB is almost the same as the radio protocol architecture in the user plane on the PHY 301 and the L2 305, but there is no header compression for the control plane. The control plane also comprises an RRC sublayer 306 in the layer 3 (L3). The RRC sublayer 306 is responsible for acquiring radio resources (i.e., radio bearer) and configuring the lower layer using an RRC signaling between the gNB and the UE.

In one embodiment, the radio protocol architecture in FIG. 3 is applicable to the UE in the present disclosure.

In one embodiment, the radio protocol architecture in FIG. 3 is applicable to the base station in the present disclosure.

In one embodiment, the first radio signal in the present disclosure is generated by the PHY 301.

In one embodiment, the first bit block in the present disclosure is generated by the PHY 301.

In one embodiment, the first sub-block in the present disclosure is generated by the PHY 301.

In one embodiment, the second bit block in the present disclosure is generated by the PHY 301.

In one embodiment, the first information in the present disclosure is generated by the RRC sublayer 306.

In one embodiment, the first information in the present disclosure is generated by the MAC sublayer 302.

In one embodiment, the first signaling in the present disclosure is generated by the PHY 301.

Embodiment 4

Figure 4:
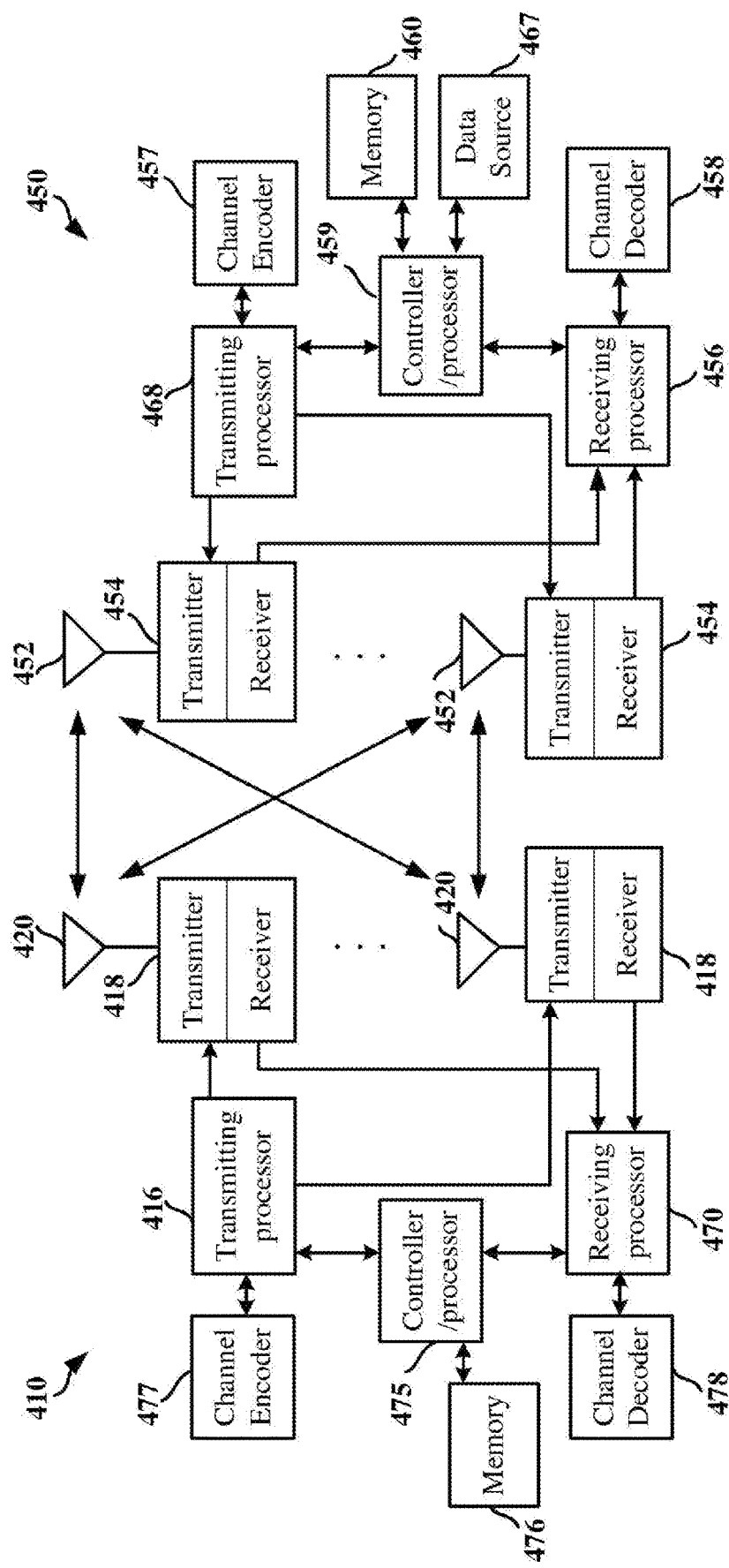
FIG. 4 illustrates a schematic diagram of New Radio (NR) node and a UE according to one embodiment of the present disclosure.

Embodiment 4 illustrates a schematic diagram of New Radio (NR) node and a UE, as shown in FIG. 4. FIG. 4 is a block diagram of a UE 450 and a gNB 410 in communication with each other in an access network.

The gNB 410 comprises a controller/processor 475, a memory 476, a receiving processor 470, a transmitting processor 416, a channel encoder 477, a channel decoder 478, a transmitter/receiver 418 and an antenna 420.

The UE 450 comprises a controller/processor 459, a memory 460, a data source 467, a transmitting processor 468, a receiving processor 456, a channel encoder 457, a channel decoder 458, a transmitter/receiver 454 and an antenna 452.

In Downlink (DL) transmission, at the gNB 410, a higher layer packet from a core network is provided to the controller/processor 475. The controller/processor 475 implements the functionality of the L2 layer. In DL, the controller/processor 475 provides header compression, encryption, packet segmentation and reordering, multiplexing between a logical channel and a transport channel, and allocation of radio resources of the UE 450 based on various priorities. The controller/processor 475 is also in charge of HARQ operation, a retransmission of a lost packet and a signaling to the UE 450. The transmitting processor 416 and the channel encoder 477 perform signaling processing functions used for the L1 layer (that is, PHY). The channel encoder 477 performs coding and interleaving so as to ensure a Forward Error Correction (FEC) at the UE 450 side. The transmitting processor 416 implements the mapping to signal clusters corresponding to each modulation scheme (i.e., BPSK, QPSK, M-PSK, and M-QAM, etc.), and performs spatial precoding/beamforming processing on encoded and modulated signals to generate one or more spatial streams. The transmitting processor 416 then maps each spatial stream into a subcarrier. The mapped symbols are multiplexed with a reference signal (i.e., pilot frequency) in time domain and/or frequency domain, and then they are assembled through Inverse Fast Fourier Transform (IFFT) to generate a physical channel carrying time-domain multicarrier symbol streams. Each transmitter 418 converts a baseband multicarrier symbol stream provided by the transmitting processor 416 into a radio frequency (RF) stream, which is later provided to different antennas 420.

In DL transmission, at the UE 450, each receiver 454 receives a signal via a corresponding antenna 452. Each receiver 454 recovers information modulated to the RF carrier, and converts the radio frequency stream into a baseband multicarrier symbol stream to be provided to the receiving processor 456. The receiving processor 456 and the channel encoder 458 perform signal processing functions of the L1 layer. The receiving processor 456 converts the baseband multicarrier symbol stream from time domain into frequency domain using FFT. In frequency domain, a physical layer data signal and a reference signal are de-multiplexed by the receiving processor 456, wherein a reference signal is used for channel estimation, while physical layer data is subjected to multi-antenna detection in the receiving processor 456 to recover UE 450-targeted spatial streams. Symbols on each spatial stream are demodulated and recovered in the receiving processor 456 to generate a soft decision. Then the channel decoder 458 decodes and de-interleaves the soft decision to recover the higher-layer data and control signal transmitted by the gNB 410. Next, the higher-layer data and control signal are provided to the controller/processor 459. The controller/processor 459 performs functions of the L2 layer. The controller/processor 459 can be connected to a memory 460 that stores program code and data. the memory 460 can be called a computer readable medium. In DL transmission, the controller/processor 459 provides demultiplexing between a transport channel and a logical channel, packet reassembling, decrypting, header decompression and control signal processing so as to recover a higher-layer packet from the core network. The higher-layer packet is later provided to all protocol layers above the L2 layer, or various control signals can be provided to the L3 layer for processing. The controller/processor 459 also performs error detection using ACK and/or NACK protocols as a way to support HARQ operation.

In Uplink (UL) transmission, at the UE 450, the data source 467 is configured to provide a higher-layer packet to the controller/processor 459. The data source 467 represents all protocol layers above the L2 layer. Similar to a transmitting function of the gNB 410 described in DL transmission, the controller/processor 459 performs header compression, encryption, packet segmentation and reordering, and multiplexing between a logical channel and a transport channel based on radio resource allocation of the gNB 410 so as to provide the L2 layer functions used for the user plane and the control plane. The controller/processor 459 is also responsible for HARQ operation, retransmission of a lost packet, and a signaling to the gNB 410. The channel encoder 457 performs channel coding, and then encoded data is subjected to modulation and multi-antenna spatial precoding/beamforming by the transmitting processor 468 to be modulated into multicarrier/single-carrier symbol streams. The modulated symbol streams are provided from the transmitter 454 to each antenna 452. Each transmitter 454 first converts a baseband symbol stream provided by the transmitting processor 468 into a radio frequency symbol stream, and then provides the radio frequency symbol stream to the antenna 452.

In UL transmission, the function of the gNB 410 is similar to the receiving function of the UE 450 described in DL transmission. Each receiver 418 receives a radio frequency signal via a corresponding antenna 420, converts the received radio frequency signal into a baseband signal, and provides the baseband signal to the receiving processor 470. The receiving processor 470 and the channel decoder 478 jointly provide functions of the L1 layer. The controller/processor 475 provides functions of the L2 layer. The controller/processor 475 can be connected with the memory 476 that stores program code and data. The memory 476 can be called a computer readable medium. In UL transmission, the controller/processor 475 provides de-multiplexing between a transport channel and a logical channel, packet reassembling, decrypting, header decompression, control signal processing so as to recover a higher-layer packet from the UE 450. The higher-layer packet coming from the controller/processor 475 may be provided to the core network. The controller/processor 475 can also perform error detection using ACK and/or NACK protocols to support HARQ operation.

In one embodiment, the UE 450 comprises at least one processor and at least one memory. The at least one memory includes computer program codes. The at least one memory and the computer program codes are configured to be used in collaboration with the at least one processor. The UE 450 at least performs the K channel listenings respectively on the K frequency sub-bands; determines that the first radio signal can only be transmitted In K1 frequency sub-band(s) out of the K frequency sub-bands; and transmits the first radio signal on the K1 frequency sub-band(s). Herein, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the UE 450 comprises a memory that stores a computer readable instruction program. The computer readable instruction program generates an action when executed by at least one processor. The action includes: performing the K channel listenings respectively on the K frequency sub-bands; determining that the first radio signal can only be transmitted In K1 frequency sub-band(s) out of the K frequency sub-bands; and transmitting the first radio signal on the K1 frequency sub-band(s). Herein, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the gNB 410 comprises at least one processor and at least one memory. The at least one memory includes computer program codes. The at least one memory and the computer program codes are configured to be used in collaboration with the at least one processor. The gNB 410 at least monitors the first radio signal respectively on the K frequency sub-bands; determines that the first radio signal only needs to be transmitted In K1 frequency sub-band(s) out of the K frequency sub-bands; and receives the first radio signal on the K1 frequency sub-band(s). Herein, the monitoring action is used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the gNB 410 comprises a memory that stores a computer readable instruction program. The computer readable instruction program generates an action when executed by at least one processor. The action includes: monitoring the first radio signal respectively on the K frequency sub-bands; determining that the first radio signal only needs to be transmitted In K1 frequency sub-band(s) out of the K frequency sub-bands; and receiving the first radio signal on the K1 frequency sub-band(s). Herein, the monitoring action is used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the gNB 410 corresponds to the base station in the present disclosure.

In one embodiment, the UE 450 corresponds to the UE in the present disclosure.

In one embodiment, at least one of the antenna 452, the receiver 454 or the receiving processor 456 is used for performing the K channel listenings of the present disclosure respectively on the K frequency sub-bands of the present disclosure.

In one embodiment, at least one of the antenna 420, the receiver 418, the receiving processor 470 or the channel decoder 478 is used for monitoring the first radio signal of the present disclosure respectively on the K frequency sub-bands of the present disclosure.

In one embodiment, at least one of the antenna 452, the receiver 454 or the receiving processor 456 is used for determining that the first radio signal of the present disclosure can only be transmitted In K1 frequency sub-band(s) out of the K frequency sub-bands of the present disclosure.

In one embodiment, at least one of the antenna 420, the receiver 418, the receiving processor 470 or the channel decoder 478 is used for determining that the first radio signal of the present disclosure only needs to be transmitted In K1 frequency sub-band(s) out of the K frequency sub-bands of the present disclosure.

In one embodiment, at least one of the antenna 452, the transmitter 454, the transmitting processor 468, the channel encoder 457, the controller/processor 459, the memory 460 or the data source 467 is used for transmitting the first radio signal of the present disclosure on the K1 frequency sub-band(s) of the present disclosure; at least one of the antenna 420, the receiver 418, the receiving processor 470, the channel decoder 478, the controller/processor 475 or the memory 476 is used for receiving the first radio signal of the present disclosure on the K1 frequency sub-band(s) of the present disclosure.

In one embodiment, the channel decoder 457 is used for performing the first channel coding in the present disclosure; the channel encoder 478 is used for performing the first channel decoding in the present disclosure.

In one embodiment, at least one of the antenna 420, the transmitter 418, the transmitting processor 416, the channel encoder 477, the controller/processor 475 or the memory 476 is used for transmitting the first information in the present disclosure; at least one of the antenna 452, the receiver 454, the receiving processor 456, the channel decoder 458, the controller/processor 459, the memory 460 or the data source 467 is used for receiving the first information in the present disclosure.

In one embodiment, at least one of the antenna 420, the transmitter 418, the transmitting processor 416, the channel encoder 477, the controller/processor 475 or the memory 476 is used for transmitting the first signaling in the present disclosure; at least one of the antenna 452, the receiver 454, the receiving processor 456, the channel decoder 458, the controller/processor 459, the memory 460 or the data source 467 is used for receiving the first signaling in the present disclosure.

In one embodiment, at least one of the antenna 452, the receiver 454 or the receiving processor 456 is used for choosing the first time window in the present disclosure from Q time windows in the present disclosure.

Embodiment 5

Figure 5:
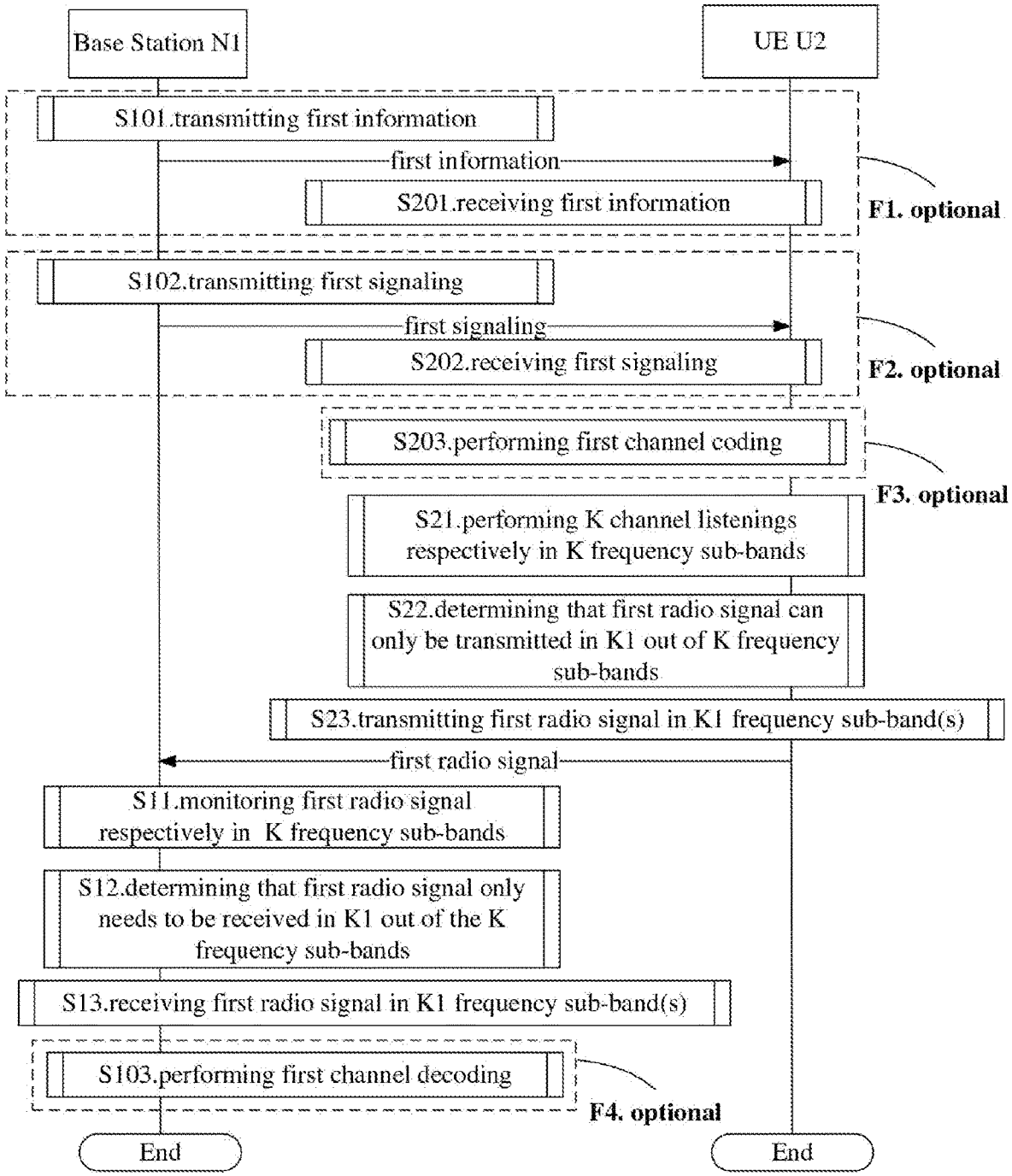
FIG. 5 illustrates a flowchart of wireless transmission according to one embodiment of the present disclosure.

Embodiment 5 illustrates a flowchart of wireless transmission, as shown in FIG. 5. In FIG. 5, a base station N1 is a maintenance base station for a serving cell of a UE U2. In FIG. 5, steps in boxes F1 to F4 are optional respectively.

The N1 transmits first information in step S101; transmits a first signaling in step S102; monitors a first radio signal respectively in K frequency sub-bands in step S11; determines that the first radio signal only needs to be transmitted in K1 out of the K frequency sub-bands in step S12; receives the first radio signal on the K1 frequency sub-band(s) in step S13; and performs a first channel decoding in step S103.

The U2 receives first information in step S201; receives a first signaling in step S202; performs a first channel coding in step S203; performs K channel listenings respectively in K frequency sub-bands in step S21; determines that a first radio signal can only be transmitted in K1 out of the K frequency sub-bands in step S22; and transmits the first radio signal on the K1 frequency sub-band(s) in step S23.

In Embodiment 5, the K channel listenings are used by the U2 for determining the K1 frequency sub-band(s) out of the K frequency sub-bands; the monitoring action is used by the N1 for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K. An input to the first channel coding comprises the first bit block, an output after the first channel coding is used by the U2 for generating the K1 first sub-signal(s); a channel coding corresponding to the first channel decoding is the first channel coding, an output after the first channel decoding is used by the N1 for recovering the first bit block. The first information is used for determining Q time windows, a time domain resource occupied by the first radio signal belongs to a first time window of the Q time windows; the Q is a positive integer greater than 1. The first signaling indicates a frequency domain resource occupied by the first radio signal.

In one embodiment, the monitoring refers to energy detection, namely, sensing energies of radio signals respectively on each of the K frequency sub-bands and averaging in time to acquire a receiving energy. For any given frequency sub-band of the K frequency sub-bands, if the receiving energy is greater than a first given threshold on the given frequency sub-band, it is then determined that the first radio signal needs to be received on the given frequency sub-band; or if the receiving energy is not greater than a first given threshold on the given frequency sub-band, it is then determined that there is no need to receive the first radio signal on the given frequency sub-band.

In one embodiment, the monitoring refers to coherent detection, namely, performing coherent reception respectively on each of the K frequency sub-bands and measuring a signal energy acquired by the coherent reception. For any given frequency sub-band of the K frequency sub-bands, if the signal energy acquired by the coherent reception is greater than a second given threshold on the given frequency sub-band, it is then determined that the first radio signal needs to be received on the given frequency sub-band; or if the signal energy acquired by the coherent reception is not greater than a second given threshold on the given frequency sub-band, it is then determined that there is no need to receive the first radio signal on the given frequency sub-band.

In one embodiment, the monitoring refers to blind detection, namely, receiving a signal respectively on each of the K frequency sub-bands and performing decoding. For any given frequency sub-band of the K frequency sub-bands, if the decoding is determined to be correct based on a check bit on the given frequency sub-band, it is then determined that the first radio signal needs to be received on the given frequency sub-band; or if the decoding is determined to be incorrect based on a check bit on the given frequency sub-band, it is then determined that there is no need to receive the first radio signal on the given frequency sub-band.

In one embodiment, a number of REs occupied by any of the K1 first sub-signal(s) in time-frequency domain is unrelated to the K1.

In one embodiment, the number of bits comprised in the first bit block is a candidate value of M candidate values; the M is a positive integer greater than 1, the M candidate values are positive integers respectively.

In one embodiment, the first bit block comprises a first sub-block, the first sub-block comprises a positive integer number of bits; the first sub-block indicates the number of bits comprised in the first bit block.

In one embodiment, a position of the first sub-block in the first bit block is determined by default.

In one embodiment, the first channel coding is based on a polar code; reliability of a sub-channel mapped by a bit in the first sub-block is greater than reliability of a sub-channel mapped by a bit in the first bit block other than the first sub-block.

In one embodiment, the first radio signal comprises K1 second sub-signal(s), the K1 second sub-signal(s) is(are) respectively transmitted in the K1 frequency sub-band(s), each of the K1 second sub-signal(s) carries a second bit block, the second bit block comprises a positive integer number of bits.

In one embodiment, the U2 spontaneously chooses the first time window from the Q time windows.

In one embodiment, the first radio signal is transmitted in an uplink physical layer data channel (i.e., an uplink channel capable of carrying physical layer data).

In one subembodiment of the above embodiment, the uplink physical layer data channel is a Physical Uplink Shared CHannel (PUSCH).

In one subembodiment of the above embodiment, the uplink physical layer data channel is a short PUSCH (sPUSCH).

In one subembodiment of the above embodiment, the uplink physical layer data channel is a New Radio PUSCH (NR-PUSCH).

In one subembodiment of the above embodiment, the uplink physical layer data channel is a Narrow Band PUSCH (NB-PUSCH).

In one embodiment, the first information is transmitted in a downlink physical layer data channel (i.e., a downlink channel capable of carrying physical layer data).

In one subembodiment, the downlink physical layer data channel is a Physical Downlink Shared CHannel (PDSCH).

In one subembodiment, the downlink physical layer data channel is a short PDSCH (sPDSCH).

In one subembodiment, the downlink physical layer data channel is a New Radio PDSCH (NR-PDSCH).

In one subembodiment, the downlink physical layer data channel is a Narrow Band PDSCH (NB-PDSCH).

In one embodiment, the first information is transmitted in a downlink physical layer control channel (i.e., a downlink channel capable of carrying a physical layer signaling).

In one subembodiment, the downlink physical layer control channel is a Physical Downlink Control Channel (PDCCH).

In one subembodiment, the downlink physical layer control channel is a short PDCCH (sPDCCH).

In one subembodiment, the downlink physical layer control channel is a New Radio PDCCH (NR-PDCCH).

In one subembodiment, the downlink physical layer control channel is a Narrow Band PDCCH (NB-PDCCH).

In one embodiment, the first signaling is transmitted in a downlink physical layer control channel (i.e., a downlink channel only capable of carrying a physical layer signaling).

Embodiment 6

Figure 6:
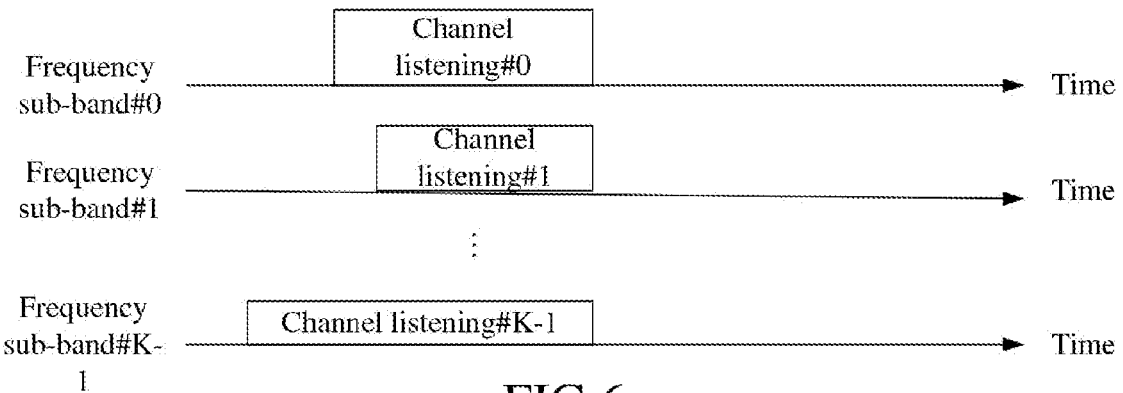
FIG. 6 illustrates a schematic diagram of K channel listenings according to one embodiment of the present disclosure.

Embodiment 6 illustrates a schematic diagram of K channel listenings; as shown in FIG. 6.

In Embodiment 6, the K channel listenings are respectively performed on the K frequency sub-bands of the present disclosure. The K channel listenings are respectively used for determining whether the K frequency sub-bands can be used for transmitting the first radio signal in the present disclosure. K1 out of the K channel listenings is(are) respectively used for determining that the K1 frequency sub-band(s) in the present disclosure can be used for transmitting the first radio signal, the K1 channel listening(s) is(are) respectively performed on the K1 frequency sub-band(s). The K channel listenings are performed separately. In FIG. 6, indices of the K frequency sub-bands and the K channel listenings are #0, #1, . . . , #K−1, respectively.

In one embodiment, any of the K channel listenings is LBT.

In one embodiment, any of the K channel listenings is a CCA.

In one embodiment, the specific meaning and implementation method of the CCA can be found in 3GPP TR36.889.

In one embodiment, any of the K channel listenings is realized with the method defined in 3GPP TS36.213, chapter 15.

In one embodiment, any of the K channel listenings is an Uplink Channel access procedure.

In one embodiment, a detailed description of the uplink channel access procedure can be found in 3GPP TS36.213, chapter 15.2.

In one embodiment, any of the K channel listenings is Category 4 LBT.

In one embodiment, at least one of the K channel listenings is Category 4 LBT.

In one embodiment, any of the K channel listenings is Category 2 LBT.

In one embodiment, at least one of the K channel listenings is Category 2 LBT.

In one embodiment, the specific meaning and implementation method of Category 4 LBT can be found in 3GPP TR36.889.

In one embodiment, the specific meaning and implementation method of Category 2 LBT can be found in 3GPP TR36.889.

In one embodiment, any of the K channel listenings is sub-band LBT.

In one embodiment, any of the K channel listenings is LBT performed on a band with 20 MHz bandwidth.

In one embodiment, any of the K channel listenings is LBT performed with a unit of 20 MHz bandwidth in frequency domain.

In one embodiment, any two of the K channel listenings have a same end time.

In one embodiment, at least two of the K channel listenings have a same start time.

In one embodiment, at least two of the K channel listenings have different start times.

In one embodiment, any two of the K channel listenings correspond to separate counters N, the specific meaning of the counter N can be found in 3GPP TS36.213 (V14.1.0), chapter 15.1.1.

In one embodiment, at least two of the K channel listenings correspond to different counters N.

In one embodiment, when the UE of the present disclosure stops transmission on any given frequency sub-band of the K frequency sub-bands, for any given channel listening of the K channel listenings other than the channel listening corresponding to the given frequency sub-band, the UE, after waiting for $4T_{sl}$ or reinitializing a counter N corresponding to the given channel listening, will continue to reduce a counter N corresponding to the given channel listening when an idle slot is detected.

In one embodiment, an end time for any of the K channel listenings is no later than a start time for a time domain resource occupied by the first radio signal of the present disclosure.

Embodiment 7

Figure 7:
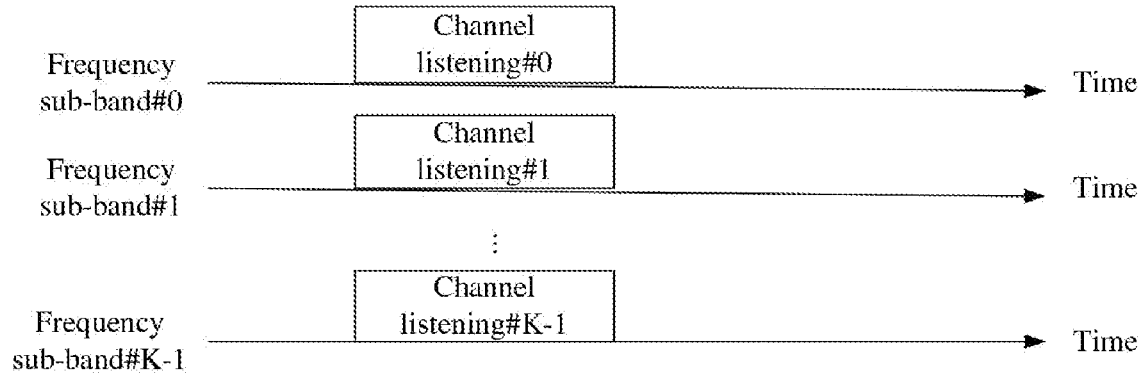
FIG. 7 illustrates a schematic diagram of K channel listenings according to one embodiment of the present disclosure.

Embodiment 7 illustrates a schematic diagram of K channel listenings; as shown in FIG. 7.

In Embodiment 7, the K channel listenings are performed separately. The K channel listenings correspond to a same counter N, the specific meaning of the counter N can be found in 3GPP TS36.213(V14.1.0), chapter 15.1.1. In FIG. 7, indices of the K frequency sub-bands and the K channel listenings are #0, #1, . . . , #K−1, respectively.

In one embodiment, a counter N corresponding to all of the K channel listenings is equal to a reference counter, the reference counter is a counter N corresponding to one of the K channel listenings that corresponds to a frequency sub-band with a greatest CWp among the K frequency sub-bands.

In one embodiment, the CWp is the size of contention window, the specific meaning of the CWp can be found in 3GPP TS36.213, chapter 15.

In one embodiment, when the UE in the present disclosure stops transmission on any given frequency sub-band of the K frequency sub-bands, the UE reinitializes the counter N corresponding to all of the K channel listenings.

In one embodiment, any two of the K channel listenings have a same start time.

Embodiment 8

Figure 8:
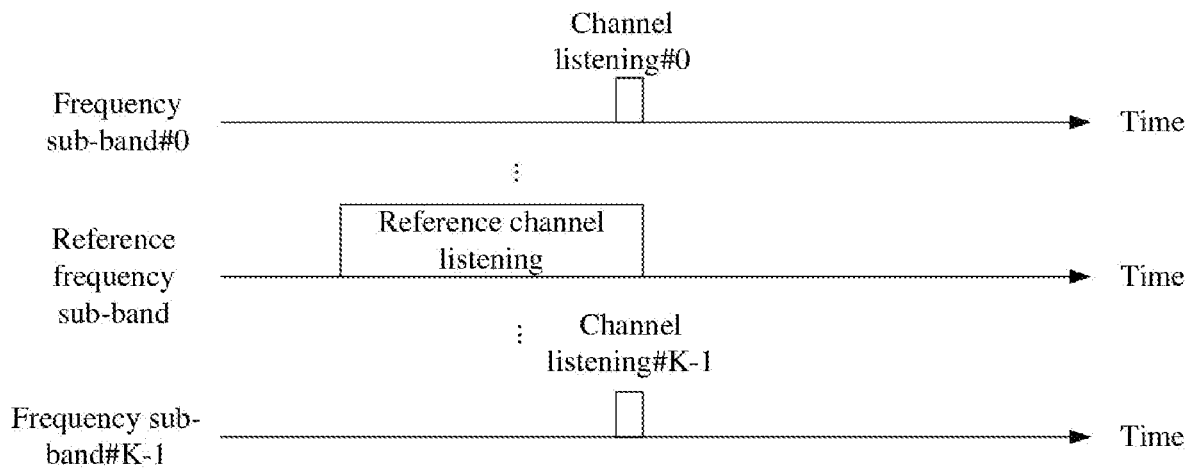
FIG. 8 illustrates a schematic diagram of K channel listenings according to one embodiment of the present disclosure.

Embodiment 8 illustrates a schematic diagram of K channel listenings; as shown in FIG. 8.

In Embodiment 8, whether any of the K frequency sub-bands can be used for transmitting radio signals is related to a reference channel listening, the reference channel listening is a channel listening of the K channel listenings that corresponds to a reference frequency sub-band, the reference frequency sub-band is one of the K frequency sub-bands.

In one embodiment, only one of the K channel listenings is Category 4 LBT.

In one embodiment, at least one of the K channel listenings is Category 2 LBT.

In one embodiment, K−1 channel listening(s) out of the K channel listenings is(are) Category 2 LBT.

In one embodiment, the reference channel listening is Category 4 LBT.

In one embodiment, there is at least one given frequency sub-band in the K frequency sub-bands, whether the given frequency sub-band can be used for transmitting radio signals is related to one of the K channel listenings other than the channel listening corresponding to the given frequency sub-band.

In one embodiment, any of the K channel listenings other than the reference channel listening is Category 2 LBT.

In one embodiment, whether the reference frequency sub-band can be used for transmitting radio signals is only related to the reference channel listening of the K channel listenings.

In one embodiment, if the reference channel listening determines that the reference frequency sub-band is idle, the reference frequency sub-band can be used for transmitting radio signals; if the reference channel listening determines that the reference frequency sub-band is busy, the reference frequency sub-band cannot be used for transmitting radio signals.

In one embodiment, for any given frequency sub-band of the K frequency sub-bands other than the reference frequency sub-band, the reference channel listening and a channel listening corresponding to the given frequency sub-band are together used for determining whether the given frequency sub-band can be used for transmitting radio signals.

In one embodiment, for any given frequency sub-band of the K frequency sub-bands other than the reference frequency sub-band, if the reference channel listening determines that the reference frequency sub-band is idle, and a channel listening corresponding to the given frequency sub-band determines that the given frequency sub-band is idle, the given frequency sub-band can be used for transmitting radio signals.

In one embodiment, for any given frequency sub-band of the K frequency sub-bands other than the reference frequency sub-band, if the reference channel listening determines that the reference frequency sub-band can be used for transmitting radio signals, and a channel listening corresponding to the given frequency sub-band determines that the given frequency sub-band is idle, the given frequency sub-band can be used for transmitting radio signals.

In one embodiment, for any given frequency sub-band of the K frequency sub-bands other than the reference frequency sub-band, if the reference channel listening determines that the reference frequency sub-band is busy, the given frequency sub-band cannot be used for transmitting radio signals.

In one embodiment, for any given frequency sub-band of the K frequency sub-bands other than the reference frequency sub-band, if the reference channel listening determines that the reference frequency sub-band cannot be used for transmitting radio signals, the given frequency sub-band cannot be used for transmitting radio signals.

In one embodiment, for any given frequency sub-band of the K frequency sub-bands other than the reference frequency sub-band, if the reference channel listening determines that the reference frequency sub-band can be used for transmitting radio signals, and a channel listening corresponding to the given frequency sub-band determines that the given frequency sub-band is idle within 25 μs before the reference frequency sub-band transmits radio signals, the given frequency sub-band can be used for transmitting radio signals.

In one embodiment, for any given frequency sub-band of the K frequency sub-bands other than the reference frequency sub-band, if a channel listening corresponding to the given frequency sub-band determines that the given frequency sub-band is busy, the given frequency sub-band cannot be used for transmitting radio signals.

In one embodiment, for any given frequency sub-band of the K frequency sub-bands other than the reference frequency sub-band, if a channel listening corresponding to the given frequency sub-band determines that the given frequency sub-band is busy within 25 μs before the reference frequency sub-band transmits radio signals, the given frequency sub-band is determined as unable to be used for transmitting radio signals.

In one embodiment, for any given frequency sub-band of the K frequency sub-bands other than the reference frequency sub-band, a channel listening corresponding to the given frequency sub-band and the reference channel listening end at the same time.

In one embodiment, the reference frequency sub-band is randomly chosen form the K frequency sub-bands.

In one embodiment, any two of the K frequency sub-bands have the same probability of being chosen as the reference frequency sub-band.

In one embodiment, any of the K frequency sub-bands shall not be chosen as the reference frequency sub-band repeatedly in 1 s.

In one embodiment, the K frequency sub-bands have a same CWp.

In one embodiment, the K frequency sub-bands correspond to separate CWp.

Embodiment 9

Figure 9:
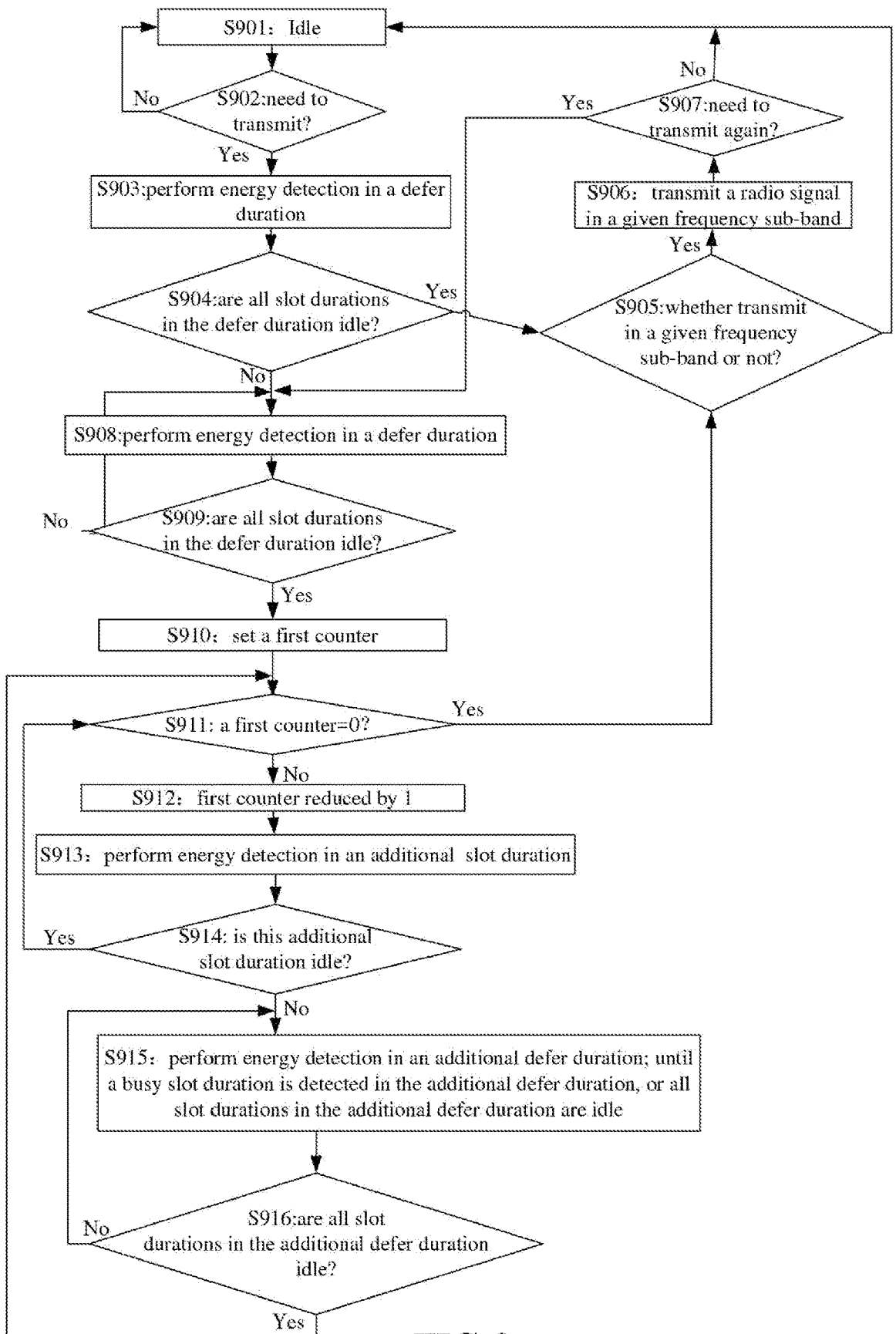
FIG. 9 illustrates a flowchart of a given channel listening out of K channel listenings according to one embodiment of the present disclosure.

Embodiment 9 illustrates a flowchart of a given channel listening out of K channel listenings; as shown in FIG. 9.

In Embodiment 9, the given channel listening is one of the K channel listenings, the given channel listening is performed on a given frequency sub-band of the K frequency sub-bands in the present disclosure. The process of the given channel listening can be described by the flowchart in FIG. 9. The UE in the present disclosure is idle in step S901, determines whether there is need for transmission in step S902, if so, move forward to step S903, otherwise go back to step S901; performs energy detection in a defer duration of the given frequency sub-band in step S903; determines whether all slot durations within the defer duration are idle in step S904, if so, move forward to step S905, otherwise move forward to step S908; determines whether to transmit on the given frequency sub-band in step S905, if so, move forward to step S906, otherwise go back to step S901; transmits a radio signal on the given frequency sub-band in step S906; determines whether to transmit again in step S907, if so, move forward to step S908, otherwise go back to step S901; performs energy detection in a defer duration of the given frequency sub-band in step S908; determines whether all slot durations within the defer duration are idle in step S909, if so, move forward to step S910, otherwise go back to step S908; initializes a first counter in step S910; determines whether the first counter is 0 in step S911, if so, go back to step S905, otherwise move forward to step S912; reduces the first counter by 1 in step S912; performs energy detection in an additional slot duration of the given frequency sub-band in step S913; determines whether the additional slot duration is idle in step S914, if so, go back to step S911, otherwise move forward to step S915; performs energy detection in an additional defer duration of the given frequency sub-band in step S915, until a busy slot duration is detected in the additional defer duration, or all slot durations within the additional defer duration are idle; determines whether all slot durations within the additional defer duration are idle in step S916, if so, go back to step S911, otherwise go back to step S915.

In one embodiment, the specific meaning of the defer duration, slot duration, additional slot duration and additional defer duration in FIG. 9 can be found in 3GPP TS36.213, chapter 15.

In one embodiment, performing energy detection in a given duration refers to: performing energy detection in all slot durations within the given duration; the given duration is any one duration of all defer durations in steps S903 and S908, all additional slot durations in step S913, and all additional defer durations in step S915 illustrated in FIG. 9.

In one embodiment, performing energy detection in a slot duration refers to: sensing a power value of a radio signal within a given time unit and averaging in time to acquire a receiving power value; the given time unit is a continuous duration in the slot duration.

In one embodiment, performing energy detection in a slot duration refers to: sensing an energy value of a radio signal within a given time unit and averaging in time to acquire a receiving energy value; the given time unit is a continuous duration in the slot duration.

In one embodiment, the phrase that a slot duration is idle refers to: sensing a power value of a radio signal in a given time unit and averaging in time, a receiving power value acquired herein is lower than a reference threshold; the given time unit is a continuous duration in the slot duration.

In one embodiment, the phrase that a slot duration is idle refers to: sensing an energy value of a radio signal in a given time unit and averaging in time, a receiving energy value acquired herein is lower than a reference threshold; the given time unit is a continuous duration in the slot duration.

In one embodiment, the given time unit lasts no shorter than 4 μs.

In one embodiment, a defer duration lasts 16 μs plus T1 time(s) of 9 μs, the T1 is a positive integer.

In one subembodiment of the above embodiment, the T1 is one of 1, 2, 3 and 7.

In one subembodiment of the above embodiment, a defer duration comprises multiple slot durations.

In one subembodiment of the above embodiment, a first slot duration and a second slot duration out of the multiple slot durations are not continuous.

In one subembodiment of the above embodiment, a time interval between a first slot duration and a second slot duration out of the multiple slot durations is 7 ms.

In one embodiment, a defer duration lasts as long as an additional defer duration.

In one embodiment, a slot duration lasts 9 μs.

In one embodiment, an additional slot duration lasts as long as a slot duration.

In one embodiment, a value of the first counter initialized in step S910 is a candidate integer of P candidate integers.

In one subembodiment, the P belongs to a collection of 3, 7, 15, 31, 63, 127, 255, 511, and 1023.

In one subembodiment, the P is a CWp in Category 4 LBT process.

In one subembodiment, the P candidate integers are 0, 1, 2 . . . , P−1, respectively.

In one subembodiment, the UE chooses one of the P candidate integers at random as an initialized value of the first counter.

In one subembodiment, any two of the P candidate integers have the same probability of being chosen as an initialized value of the first counter.

In one embodiment, the given channel listening is any of the K channel listenings.

In one embodiment, the given channel listening is the reference channel listening in Embodiment 8.

Embodiment 10

Figure 10:
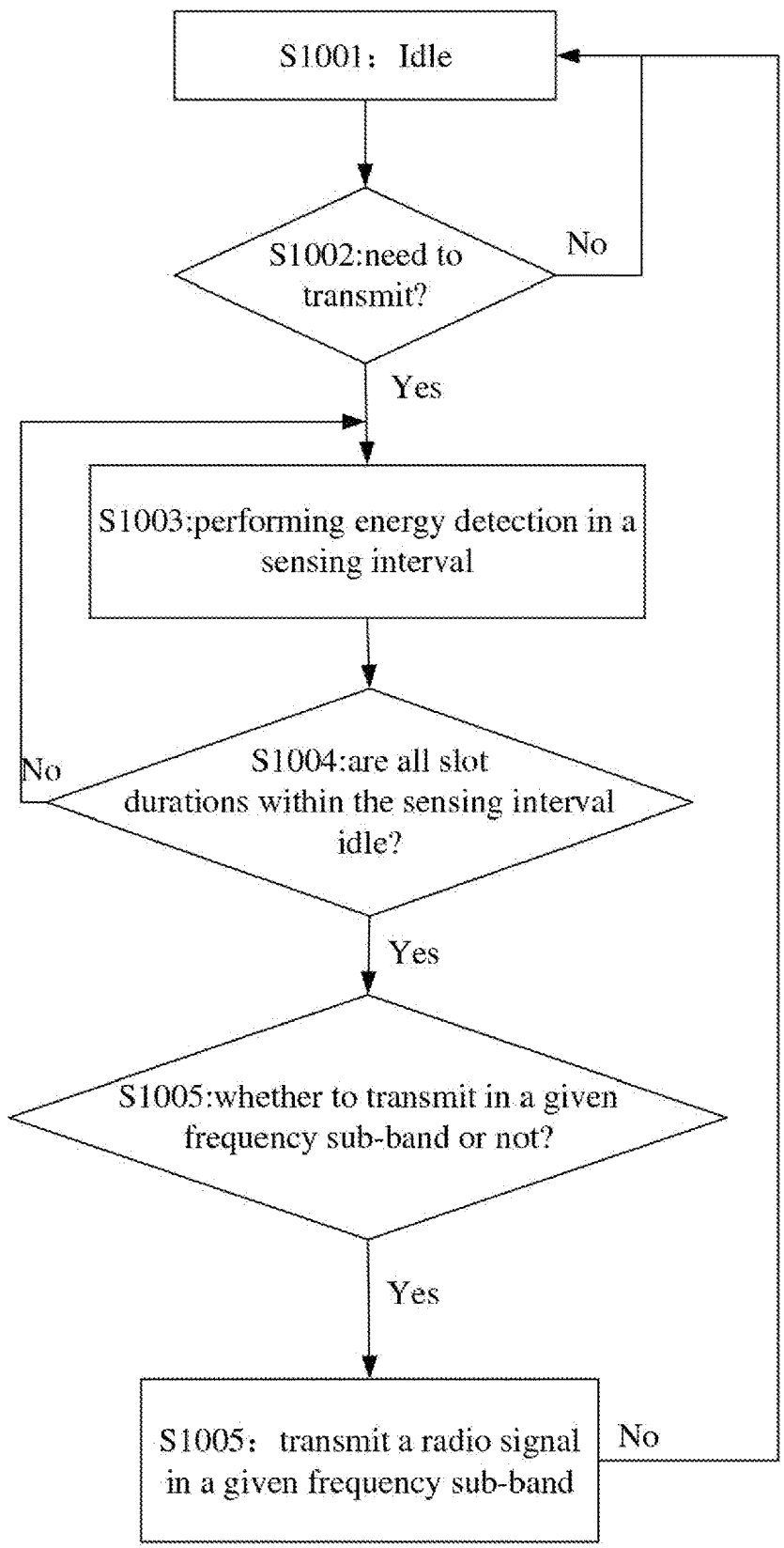
FIG. 10 illustrates a flowchart of a given channel listening out of K channel listenings according to one embodiment of the present disclosure.

Embodiment 10 illustrates a flowchart of a given channel listening out of K channel listenings; as shown in FIG. 10.

In Embodiment 10, the given channel listening is one of the K channel listenings, the given channel listening is performed on a given frequency sub-band of the K frequency sub-bands in the present disclosure. The process of the given channel listening can be described by the flowchart in FIG. 10. The UE in the present disclosure is idle in step S1001, determines whether to transmit or not in step S1002, if so, move forward to step S1003, otherwise go back to step S1001; performs energy detection in a sensing interval of the given frequency sub-band in step S1003; determines whether all slot durations within the sensing interval are idle in step S1004, if so, move forward to step S1005, otherwise go back to step S1003; and transmits a radio signal on the given frequency sub-band in step S1005.

In one embodiment, the specific meaning of the sensing interval and slot duration in FIG. 10 can be found in 3GPP TS36.213, chapter 15.2.

In one embodiment, performing energy detection in a sensing interval refers to performing energy detection in all slot durations within the sensing interval.

In one embodiment, a sensing interval lasts 25 μs.

In one embodiment, a sensing interval comprises 2 slot durations, wherein the 2 slot durations are non-consecutive in time domain.

In one subembodiment of the above embodiment, a time interval between the 2 slot durations is 7 μss.

In one embodiment, the given channel listening is any one of the K channel listenings.

Embodiment 11

Figure 11:
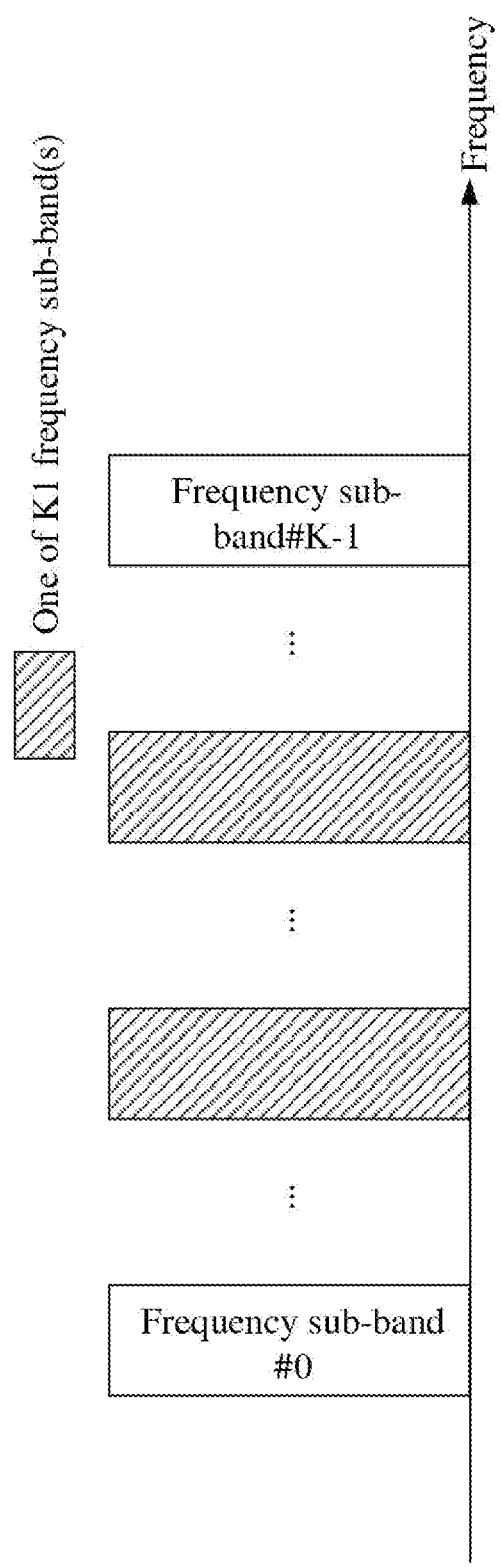
FIG. 11 illustrates a schematic diagram of resource mapping of K frequency sub-bands and K1 frequency sub-band(s) onto frequency domain according to one embodiment of the present disclosure.

Embodiment 11 illustrates a schematic diagram of resource mapping of K frequency sub-bands and K1 frequency sub-band(s) onto frequency domain; as shown in FIG. 11.

In Embodiment 11, the UE performs the K channel listenings of the present disclosure respectively on the K frequency sub-bands, and determines that the first radio signal of the present disclosure can only be transmitted in the K1 out of the K frequency sub-bands. In FIG. 11, indices of the K frequency sub-bands are #0, . . . , #K−1 respectively. A box filled with slashes represents a frequency sub-band of the K1 frequency sub-band(s).

In one embodiment, all of the K frequency sub-bands are deployed on unlicensed spectrum.

In one embodiment, any of the K frequency sub-bands comprises a carrier.

In one embodiment, any of the K frequency sub-bands comprises multiple carriers.

In one embodiment, any of the K frequency sub-bands comprises a (Bandwidth Part (BWP) of a carrier.

In one embodiment, any of the K frequency sub-bands comprises multiple BWPs of a carrier.

In one embodiment, the K frequency sub-bands belong to a same carrier.

In one embodiment, at least two of the K frequency sub-bands belong to different carriers.

In one embodiment, the K frequency sub-bands belong to a same BWP of a carrier.

In one embodiment, at least two of the K frequency sub-bands belong to different BWPs of a carrier.

In one embodiment, any of the K frequency sub-bands is a minimum frequency domain unit of LBT.

In one embodiment, any of the K frequency sub-bands is a consecutive frequency domain interval.

In one embodiment, any of the K frequency sub-bands comprises a positive integer number of consecutive subcarriers in frequency domain.

In one embodiment, any of the K frequency sub-bands comprises a positive integer number of consecutive Physical Resource Blocks (PRBs) in frequency domain.

In one embodiment, any of the K frequency sub-bands comprises a positive integer number of consecutive Resource Blocks (RBs) in frequency domain.

In one embodiment, any two of the K frequency sub-bands are orthogonal (non-overlapping) in frequency domain.

In one embodiment, any two of the K frequency sub-bands have equal bandwidth.

In one embodiment, at least two of the K frequency sub-bands have unequal bandwidth.

In one embodiment, any of the K frequency sub-bands has a bandwidth of 20 MHz.

In one embodiment, the K frequency sub-bands are consecutive in frequency domain.

In one embodiment, at least two adjacent frequency sub-bands of the K frequency sub-bands are non-consecutive in frequency domain.

In one embodiment, there is a guard interval between any two adjacent frequency sub-bands of the K frequency sub-bands in frequency domain.

In one embodiment, positions of the K1 frequency sub-bands in the K frequency sub-bands are consecutive.

In one embodiment, the K1 frequency sub-bands are consecutive in frequency domain.

In one embodiment, the K1 is less than the K.

In one embodiment, the K1 is equal to the K.

In one embodiment, the K1 frequency sub-band(s) is(are) composed of all frequency sub-band(s) out of the K frequency sub-bands determined to be idle by the K channel listenings.

In one embodiment, the K1 frequency sub-band(s) is(are) composed of all frequency sub-band(s) out of the K frequency sub-bands determined to be idle within the first time window of the present disclosure by the K channel listenings.

In one embodiment, the K1 frequency sub-band(s) is(are) composed of all frequency sub-band(s) out of the K frequency sub-bands determined to be idle by the K channel listenings and consecutively distributed in frequency domain.

In one embodiment, the K1 frequency sub-band(s) is(are) composed of all frequency sub-band(s) out of the K frequency sub-bands determined to be idle within the first time window of the present disclosure by the K channel listenings and consecutively distributed in frequency domain.

In one embodiment, the K1 frequency sub-band(s) is(are) composed of all frequency sub-band(s) out of the K frequency sub-bands determined by the K channel listenings as capable of transmitting radio signals.

In one embodiment, the K1 frequency sub-band(s) is(are) composed of all frequency sub-band(s) out of the K frequency sub-bands determined as capable of transmitting radio signals within the first time window of the present disclosure.

In one embodiment, the K1 frequency sub-band(s) is(are) composed of all frequency sub-band(s) out of the K frequency sub-bands determined as capable of transmitting radio signals and consecutively distributed in frequency domain.

In one embodiment, the K1 frequency sub-band(s) is(are) composed of all frequency sub-band(s) out of the K frequency sub-bands determined as capable of transmitting radio signals within the first time window of the present disclosure and consecutively distributed in frequency domain.

In one embodiment, a given frequency sub-band of the K frequency sub-bands other than the K1 frequency sub-band(s) is determined by a corresponding channel listening out of the K channel listenings as idle within the first time window of the present disclosure, the given frequency sub-band and any of the K1 frequency sub-band(s) are not consecutive.

In one embodiment, the monitoring action in the present disclosure and the first sub-block in the present disclosure are jointly used by the base station of the present disclosure for determining the K1 frequency sub-band(s) out of the K frequency sub-bands.

In one embodiment, the monitoring action in the present disclosure is used by the base station of the present disclosure for determining that the first radio signal is transmitted in the K1 frequency sub-band(s).

In one embodiment, the monitoring action in the present disclosure is used by the base station of the present disclosure for determining that the first radio signal is transmitted in part of the K1 frequency sub-bands.

In one embodiment, the monitoring action in the present disclosure is used by the base station of the present disclosure for determining that the first radio signal is transmitted in all of the K1 frequency sub-bands.

Embodiment 12

Figure 12:
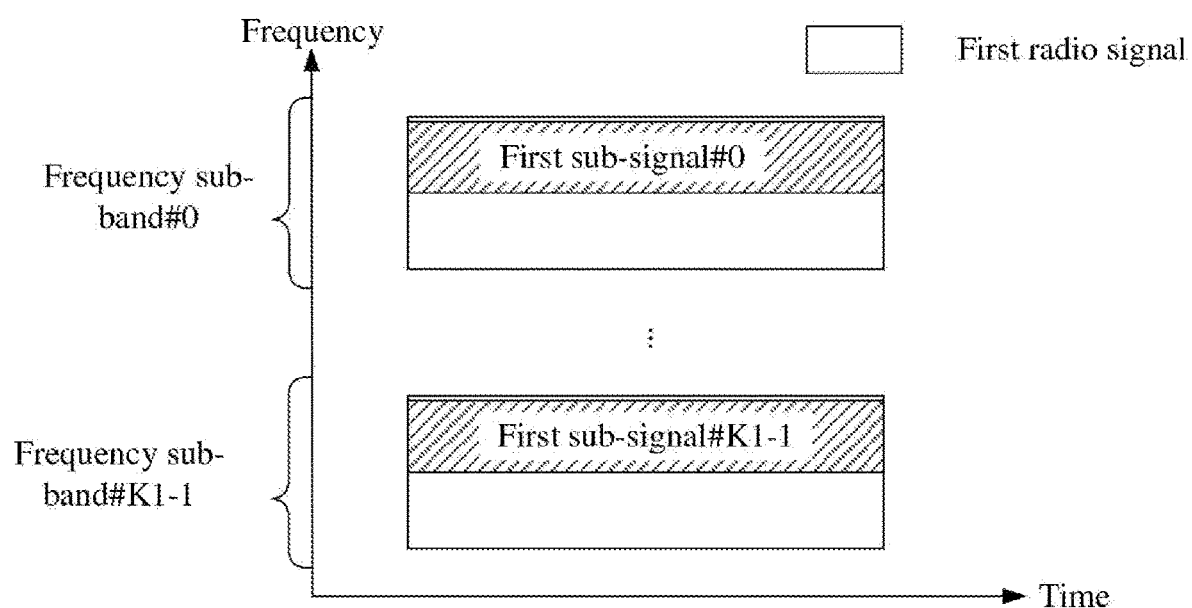
FIG. 12 illustrates a schematic diagram of resource mapping of a first radio signal and K1 first sub-signal(s) onto K1 frequency sub-band(s) according to one embodiment of the present disclosure.

Embodiment 12 illustrates a schematic diagram of resource mapping of a first radio signal and K1 first sub-signal(s) onto K1 frequency sub-band(s); as shown in FIG. 12.

In Embodiment 12, the first radio signal comprises the K1 first sub-signal(s), the K1 first sub-signal(s) is(are) respectively transmitted in the K1 frequency sub-band(s). A number of REs occupied by any of the K1 first sub-signal(s) in time-frequency domain is unrelated to the K1. In FIG. 12, index(indices) of the K1 first sub-signal(s) and the K1 frequency sub-band(s) is(are) #0, . . . , #K1−1, respectively; a box marked with thick solid lines represents the first radio signal, and a box filled with slashes represents one of the K1 first sub-signal(s).

In one embodiment, the first radio signal occupies a same time domain resource on any two of the K1 frequency sub-bands.

In one embodiment, the RE occupies a multicarrier symbol in time domain, and a subcarrier in frequency domain.

In one embodiment, the multicarrier symbol is an Orthogonal Frequency Division Multiplexing (OFDM) symbol.

In one embodiment, the multicarrier symbol is a Single Carrier-Frequency Division Multiple Access (SC-FDMA) symbol.

In one embodiment, the multicarrier symbol is a Discrete Fourier Transform Spread OFDM (DFT-S-OFDM) symbol.

In one embodiment, the phrase that the REs occupied by any of the K1 first sub-signal(s) in time-frequency domain refers to all REs occupied by any of the K1 first sub-signal(s) in time-frequency domain.

In one embodiment, the phrase that the REs occupied by any of the K1 first sub-signal(s) in time-frequency domain refers to REs occupied by all modulation symbols corresponding to any of the K1 first sub-signal(s) in time-frequency domain.

In one embodiment, the phrase that the REs occupied by any of the K1 first sub-signal(s) in time-frequency domain refers to REs occupied by all modulation symbols comprised by any of the K1 first sub-signal(s) in time-frequency domain.

In one embodiment, the modulation symbol is an OFDM symbol.

In one embodiment, the modulation symbol is an SC-FDMA symbol.

In one embodiment, the modulation symbol is a DFT-S-OFDM symbol.

In one embodiment, for any given first sub-signal of the K1 first sub-signal(s), a number of REs occupied by the given first sub-signal in time-frequency domain is related to a number of REs occupied by the first radio signal in a frequency sub-band corresponding to the given first sub-signal.

In one embodiment, a number of REs occupied by any of the K1 first sub-signal(s) in time-frequency domain is related to a number of bits comprised in the second bit block of the present disclosure.

In one embodiment, for any given first sub-signal of the K1 first sub-signal(s), a number of REs occupied by the given first sub-signal in time-frequency domain is related to a ratio of a number of REs occupied by the first radio signal in a frequency sub-band corresponding to the given first sub-signal to a number of bits comprised in the second bit block of the present disclosure.

In one embodiment, a number of REs occupied by any of the K1 first sub-signal(s) in time-frequency domain is related to the number of bits comprised in the first bit block of the present disclosure.

In one embodiment, for any given first sub-signal of the K1 first sub-signal(s), a number of REs occupied by the given first sub-signal in time-frequency domain is equal to a product of a first offset, a first reference value and the number of bits comprised in the first bit block of the present disclosure; wherein the first offset is a positive real number, the first reference value is a ratio of a number of REs occupied by the first radio signal in a frequency sub-band corresponding to the given first sub-signal to a number of bits comprised in the second bit block of the present disclosure.

In one subembodiment of the above embodiment, the first offset is indicated by a higher layer signaling.

In one subembodiment of the above embodiment, the first offset is indicated by an RRC signaling.

In one subembodiment of the above embodiment, the first offset is indicated by a Medium Access Control layer Control Element (MAC CE) signaling.

In one subembodiment of the above embodiment, the first offset is indicated by a physical layer signaling.

In one subembodiment of the above embodiment, the first offset is indicated by a dynamic signaling.

In one subembodiment of the above embodiment, the first signaling in the present disclosure indicates the first offset.

In one subembodiment of the above embodiment, the first information in the present disclosure indicates the first offset.

In one subembodiment of the above embodiment, the first offset is semi-statically configured.

In one subembodiment of the above embodiment, the first offset is dynamically configured, In one embodiment, for any given first sub-signal of the K1 first sub-signal(s), a number of REs occupied by the given first sub-signal in time-frequency domain is no greater than a first limit value; the first limit value is a positive integer.

In one subembodiment of the above embodiment, the first limit value is related to a number of subcarriers occupied by the first radio signal in a frequency sub-band corresponding to the given first sub-signal.

In one subembodiment of the above embodiment, the first limit value is equal to a number of subcarriers occupied by the first radio signal in a frequency sub-band corresponding to the given first sub-signal multiplied by 4.

In one subembodiment of the above embodiment, the first limit value is related to a number of REs occupied by the first radio signal in a frequency sub-band corresponding to the given first sub-signal.

In one subembodiment of the above embodiment, the first limit value is equal to a number of REs occupied by the first radio signal in time-frequency domain minus a ratio of $Q_{RI}^{(x)}$ to $Q_m^{(x)}$. The $Q_{RI}^{(x)}$ is related to the number of bits comprised in the first bit block, and the $Q_m^{(x)}$ s related to a Modulation order of the first radio signal. The specific meaning of the $Q_{RI}^{(x)}$ and the $Q_m^{(x)}$ can be found in TS36.212.

In one embodiment, for any given first sub-signal of the K1 first sub-signal(s), REs occupied by the given first sub-signal in a given frequency sub-band constitute a first RE set; REs occupied by the first radio signal on the given frequency sub-band constitute a second RE set; a position of the first RE set in the second RE set is determined by default; the given frequency sub-band is one of the K1 frequency sub-band(s), the given first sub-signal is transmitted in the given frequency sub-band.

In one subembodiment of the above embodiment, the first RE set and the second RE set respectively comprise positive integer numbers of REs.

In one subembodiment of the above embodiment, the first RE set is a subset of the second RE set.

Embodiment 13

Figure 13:
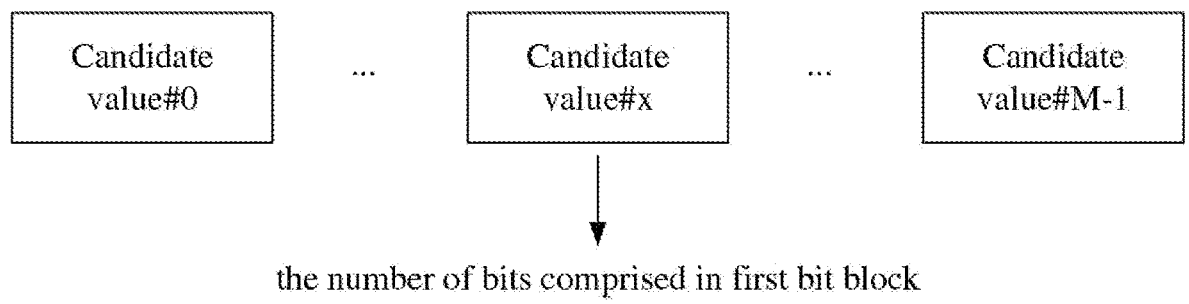
FIG. 13 illustrates a schematic diagram illustrating relations between a number of bit(s) comprised in the first bit block and M candidate values according to one embodiment of the present disclosure.

Embodiment 13 illustrates a schematic diagram illustrating relations between a number of bit(s) comprised in the first bit block and M candidate values; as shown in FIG. 13.

In Embodiment 13, the number of bits comprised in the first bit block is a candidate value of the M candidate values; the M is a positive integer greater than 1, the M candidate values are positive integers respectively. In FIG. 13, indices of the M candidate values are #0, . . . , #x, . . . , #M−1, respectively, the x is a positive integer less than M−1.

In one embodiment, the M candidate values are indicated by a higher layer signaling.

In one embodiment, the M candidate values are indicated by an RRC signaling.

In one embodiment, the M candidate values are indicated by a MAC CE signaling.

In one embodiment, the first information in the present disclosure indicates the M candidate values.

In one embodiment, the M candidate values are semi-statically configured.

In one embodiment, the UE of the present disclosure self-determines the number of bits comprised in the first bit block out of the M candidate values according to the K1 in the present disclosure.

In one embodiment, the UE of the present disclosure self-determines the number of bits comprised in the first bit block out of the M candidate values according to a total number of subcarriers occupied by the first radio signal in the present disclosure on K1 frequency sub-band(s) in the present disclosure.

In one embodiment, the UE of the present disclosure self-determines the number of bits comprised in the first bit block out of the M candidate values according to a total number of REs occupied by the first radio signal in the present disclosure on the K1 frequency sub-band(s) in the present disclosure.

In one embodiment, the M candidate values are sequentially arranged in magnitude.

In one embodiment, the M candidate values are sequentially arranged in an ascending order.

In one embodiment, M−1 thresholds are sequentially arranged in an ascending order; if the K1 in the present disclosure is greater than a threshold #i−1 of the M−1 thresholds and is no greater than a threshold #i of the M−1 thresholds, the number of bits comprised in the first bit block is equal to a candidate value #i of the M candidate values, the i is a positive integer less than the M−1; if the K1 in the present disclosure is no greater than a threshold #0 of the M−1 thresholds, the number of bits comprised in the first bit block is equal to a candidate value #0 of the M candidate values; if the K1 is greater than a threshold #M−2 of the M−1 thresholds, the number of bits comprised in the first bit block is equal to a candidate value #M−1 of the M candidate values.

In one sub-embodiment of the above embodiment, indices of the M−1 thresholds are #0, . . . , and #M−2 respectively.

Embodiment 14

Figure 14:
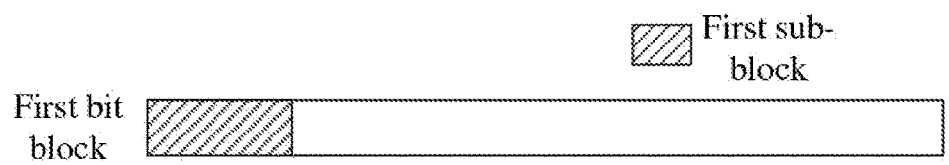
FIG. 14 illustrates a schematic diagram of a first sub-block and a first bit block according to one embodiment of the present disclosure.

Embodiment 14 illustrates a schematic diagram of a first sub-block and a first bit block; as shown in FIG. 14.

In Embodiment 14, the first bit block comprises the first sub-block; the first sub-block indicates the number of bits comprised in the first bit block; the position of the first sub-block in the first bit block is determined by default.

In one embodiment, bits in the first bit block are sequentially arranged.

In one embodiment, bits in the first sub-block are sequentially arranged.

In one embodiment, the first sub-block explicitly indicates the number of bits comprised in the first bit block.

In one embodiment, the first sub-block implicitly indicates the number of bits comprised in the first bit block.

In one embodiment, the first sub-block indicates the K1 in the present disclosure.

In one embodiment, the first sub-block is used for determining the K1 frequency sub-band(s) in the present disclosure.

In one embodiment, the first sub-block indicates the K1 frequency sub-band(s) in the present disclosure out of the K frequency sub-bands in the present disclosure.

In one embodiment, the number of bits comprised in the first sub-block is unrelated to the K1 in the present disclosure.

In one embodiment, the number of bits comprised in the first sub-block is unrelated to the number of bits comprised in the first bit block.

In one embodiment, the number of bits comprised in the first sub-block is pre-configured.

In one embodiment, the number of bits comprised in the first sub-block is fixed.

In one embodiment, the first sub-block indicates types of part of information carried by the first bit block.

In one subembodiment of the above embodiment, the types of the part of information include one or more of a HARQ-ACK, an SR, CSI, CRI, a PMI, RSRP, RSRQ or a CQI.

In one embodiment, the phrase that the position of the first sub-block in the first bit block is determined by default refers to: the position of the first sub-block in the first bit block does not need to be configured by a downlink signaling.

In one embodiment, the phrase that the position of the first sub-block in the first bit block is determined by default refers to: the position of the first sub-block in the first bit block does not to be explicitly configured by a downlink signaling.

In one embodiment, the phrase that the position of the first sub-block in the first bit block is determined by default refers to: the position of the first sub-block in the first bit block is fixed.

In one embodiment, the phrase that the position of the first sub-block in the first bit block is determined by default refers to: for the first bit block with a fixed number of bits, the position of the first sub-block in the first bit block is fixed.

In one embodiment, the number of bits comprised in the first sub-block is equal to S1, i.e., the first sub-block is composed by S1 bit(s) in the forefront of the first bit block; the S1 is a positive integer.

In one embodiment, the number of bits comprised in the first sub-block is equal to S1, i.e., the first sub-block is composed by S1 bit(s) with smallest index(indices) in the first bit block; the S1 is a positive integer.

In one embodiment, the position of the first sub-block in the first bit block comprises a starting position(s) of bit(s) of the first sub-block in the first bit block.

In one embodiment, the position of the first sub-block in the first bit block comprises an ending position(s) of bit(s) of the first sub-block in the first bit block.

In one embodiment, the position of the first sub-block in the first bit block comprises a position of each bit of the first sub-block in the first bit block.

In one embodiment, positions of bits of the first sub-block in the first bit block are consecutive.

In one embodiment, the position of the first sub-block in the first bit block is unrelated to the K1.

Embodiment 15

Figure 15:
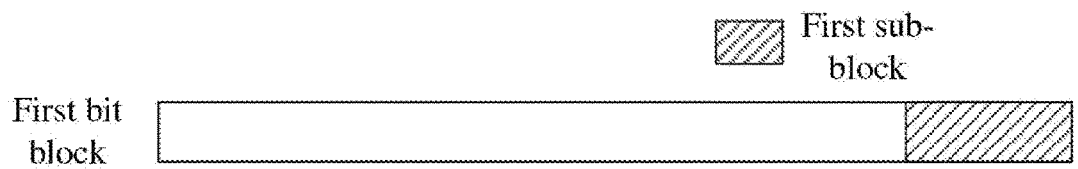
FIG. 15 illustrates a schematic diagram of a first sub-block and a first bit block according to one embodiment of the present disclosure.

Embodiment 15 illustrates a schematic diagram of a first sub-block and a first bit block; as shown in FIG. 15.

In Embodiment 15, the number of bits comprised in the first sub-block is equal to S1, the first sub-block is composed by S1 bit(s) at the rear of the first bit block; the S1 is a positive integer.

In one embodiment, the number of bits comprised in the first sub-block is equal to S1, the first sub-block is composed by S1 bit(s) with largest index(indices) in the first bit block; the S1 is a positive integer.

Embodiment 16

Figure 16:
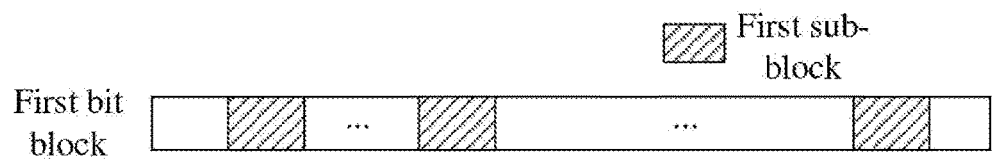
FIG. 16 illustrates a schematic diagram of a first sub-block and a first bit block according to one embodiment of the present disclosure.

Embodiment 16 illustrates a schematic diagram of a first sub-block and a first bit block; as shown in FIG. 16.

In Embodiment 16, positions of bits of the first sub-block in the first bit block are non-consecutive.

Embodiment 17

Figure 17:
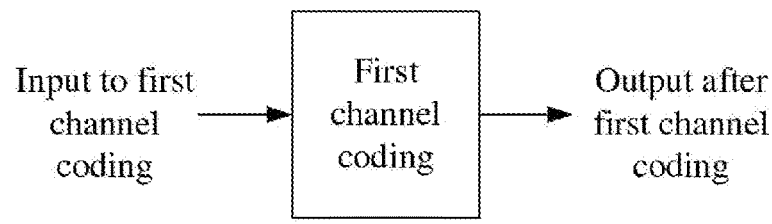
FIG. 17 illustrates a schematic diagram of a first channel coding according to one embodiment of the present disclosure.

Embodiment 17 illustrates a schematic diagram of a first channel coding; as shown in FIG. 17.

In Embodiment 17, the first channel coding is based on a polar code. An input to the first channel coding comprises the first bit block in the present disclosure, an output after the first channel coding is used for generating the K1 first sub-signal(s) in the present disclosure. Reliability of a sub-channel mapped by a bit in the first sub-block of the present disclosure is greater than reliability of a sub-channel mapped by a bit in the first bit block other than the first sub-block.

In one embodiment, the specific meaning and implementation method of the polar code can be found in 3GPP TS38.212, chapter 5.3.1.

In one embodiment, an input to the first channel coding comprises all bit(s) in the first bit block.

In one embodiment, an input to the first channel coding is the first bit block.

In one embodiment, an input to the first channel coding comprises the first bit block and a first check bit block, the first check bit block is generated by a CRC bit block of the first bit block.

In one embodiment, the phrase that the output after the first channel coding is used for generating the K1 first sub-signal(s) means that the K1 first sub-signal(s) is(are) an output after the output of the first channel coding is sequentially subjected to rate matching, concatenation, scrambling, a modulation mapper, a layer mapper, a transform precoder, precoding, a resource element mapper, multicarrier symbol generation, modulation and upconversion.

In one embodiment, the phrase that the output after the first channel coding is used for generating the K1 first sub-signal(s) means that the K1 first sub-signal(s) is(are) an output after the output of the first channel coding is sequentially subjected to rate matching, a modulation mapper, a layer mapper, precoding, a resource element mapper, multicarrier symbol generation, modulation and upconversion.

In one embodiment, the phrase that the output after the first channel coding is used for generating the K1 first sub-signal(s) means that the K1 first sub-signal(s) is(are) an output after the output of the first channel coding is sequentially subjected to concatenation, scrambling, a modulation mapper, a layer mapper, a transform precoder, precoding, a resource element mapper, multicarrier symbol generation, modulation and upconversion.

In one embodiment, the phrase that the output after the first channel coding is used for generating the K1 first sub-signal(s) means that the K1 first sub-signal(s) is(are) an output after the output of the first channel coding is sequentially subjected to a modulation mapper, a layer mapper, precoding, a resource element mapper, multicarrier symbol generation, modulation and upconversion.

In one embodiment, the first channel coding includes interleaving and polar coding, the specific meaning of the interleaving and the polar coding can be found in 3 GPP T S38.212, chapter 5.3.1.

In one embodiment, the first channel coding includes rate matching.

In one embodiment, the first channel coding includes rate matching, a number of bits comprised in the output after the first channel coding is related to the K1.

In one embodiment, the first channel coding includes rate matching, a number of bits comprised in the output after the first channel coding is linear with the K1.

In one embodiment, the first channel coding does not include rate matching.

In one embodiment, a number of bits comprised in the output after the first channel coding is unrelated to the K1.

In one embodiment, a number of bits comprised in the input to the first channel coding is unrelated to the K1.

In one embodiment, reliability of a sub-channel mapped by any bit in the first sub-block is greater than reliability of a sub-channel mapped by any bit in the first bit block other than the first sub-block.

In one embodiment, reliability of a sub-channel mapped by at least one bit in the first sub-block is greater than reliability of a sub-channel mapped by at least one bit in the first bit block other than the first sub-block.

In one embodiment, reliability of a sub-channel mapped by at least one bit in the first sub-block is greater than reliability of a sub-channel mapped by any bit in the first bit block other than the first sub-block.

In one embodiment, reliability of a sub-channel mapped by any bit in the first sub-block is greater than reliability of a sub-channel mapped by at least one bit in the first bit block other than the first sub-block.

In one embodiment, the reliability of the sub-channel refers to $W(Q_i^{N_{max}})$, the specific meaning of the $W(Q_i^{N_{max}})$ can be found in 3GPP TS38.212, chapter 5.3.1.

In one embodiment, the reliability of the sub-channel refers to a position of the sub-channel in a Polar sequence; the reliability of a first sub-channel is greater than the reliability of a second sub-channel, a position of the first sub-channel in the Polar sequence is behind a position of the second sub-channel in the Polar sequence; the first sub-channel and the second sub-channel are respectively sub-channels mapped by bits comprised in the input to the first channel coding.

In one embodiment, the reliability of the sub-channel refers to an index of the sub-channel in a Polar sequence; the reliability of a first sub-channel is greater than the reliability of a second sub-channel, an index of the first sub-channel in the Polar sequence is greater than an index of the second sub-channel in the Polar sequence; the first sub-channel and the second sub-channel are respectively sub-channels mapped by bits comprised in the input to the first channel coding.

In one embodiment, the specific meaning of the Polar sequence can be found in 3GPP TS38.212, chapter 5.3.1.

In one embodiment, an output after the first channel coding is generated by a first reference bit vector, the first reference bit vector is equal to a product of a second reference bit vector and a polar coding matrix; the second reference bit vector comprises all bit(s) in the first bit block; the polar coding matrix is $G_N$; the specific meaning of the $G_N$ can be found in 3GPP TS38.212, chapter 5.3.1.

In one subembodiment of the above embodiment, the first reference bit vector is a row vector.

In one subembodiment of the above embodiment, the second reference bit vevtor is a row vector.

In one subembodiment of the above embodiment, the output after the first channel coding is the first reference bit vector.

In one subembodiment of the above embodiment, the output after the first channel coding is acquired after the first reference bit vector is subjected to rate matching.

In one subembodiment of the above embodiment, the first reference bit vector is d, the specific meaning of the d can be found in 3GPP TS38.212, chapter 5.3.1.

In one subembodiment of the above embodiment, an index of a bit of the first sub-block in the second reference bit vector has an index in a Polar sequence greater than an index that an index of a bit of the first bit block other than the first sub-block in the second reference bit vector has in the Polar sequence.

In one subembodiment of the above embodiment, an index of any bit of the first sub-block in the second reference bit vector has an index in a Polar sequence greater than an index that an index of any bit of the first bit block other than the first sub-block in the second reference bit vector has in the Polar sequence.

In one subembodiment of the above embodiment, an index of at least one bit of the first sub-block in the second reference bit vector has an index in a Polar sequence greater than an index that an index of at least one bit of the first bit block other than the first sub-block in the second reference bit vector has in the Polar sequence.

In one subembodiment of the above embodiment, an index of at least one bit of the first sub-block in the second reference bit vector has an index in a Polar sequence greater than an index that an index of any bit of the first bit block other than the first sub-block in the second reference bit vector has in the Polar sequence.

In one subembodiment of the above embodiment, an index of any bit of the first sub-block in the second reference bit vector has an index in a Polar sequence greater than an index that an index of at least one bit of the first bit block other than the first sub-block in the second reference bit vector has in the Polar sequence.

In one subembodiment of the above embodiment, the second reference bit vector comprises all bit(s) of the first bit block and all bit(s) of a third bit block, all bit(s) of the third bit block is(are) 0.

In one subembodiment of the above embodiment, the second reference bit vector is μ, the specific meaning of the μ can be found in 3GPP TS38.212, chapter 5.3.1.

In one embodiment, an index of a bit of the first sub-block in a Polar sequence is greater than an index of a bit of the first bit block other than the first sub-block in the Polar sequence.

In one embodiment, an index of any bit of the first sub-block in a Polar sequence is greater than an index of any bit of the first bit block other than the first sub-block in the Polar sequence.

In one embodiment, an index of at least one bit of the first sub-block in a Polar sequence is greater than an index of at least one bit of the first bit block other than the first sub-block in the Polar sequence.

In one embodiment, an index of at least one bit of the first sub-block in a Polar sequence is greater than an index of any bit of the first bit block other than the first sub-block in the Polar sequence.

In one embodiment, an index of any bit of the first sub-block in a Polar sequence is greater than an index of at least one bit of the first bit block other than the first sub-block in the Polar sequence.

In one embodiment, $W(Q_i^{N_{max}})$ corresponding to a bit of the first sub-block is greater than $W(Q_i^{N_{max}})$ corresponding to a bit of the first bit block other than the first sub-block.

In one embodiment, $W(Q_i^{N_{max}})$ corresponding to any bit of the first sub-block is greater than $W(Q_i^{N_{max}})$ corresponding to any bit of the first bit block other than the first sub-block.

In one embodiment, $W(Q_i^{N_{max}})$ corresponding to at least one bit of the first sub-block is greater than $W(Q_i^{N_{max}})$ corresponding to at least one bit of the first bit block other than the first sub-block.

In one embodiment, $W(Q_i^{N_{max}})$ corresponding to at least one bit of the first sub-block is greater than $W(Q_i^{N_{max}})$ corresponding to any bit of the first bit block other than the first sub-block.

In one embodiment, $W(Q_i^{N_{max}})$ corresponding to any bit of the first sub-block is greater than $W(Q_i^{N_{max}})$ corresponding to at least one bit of the first bit block other than the first sub-block.

In one embodiment, the specific meaning of the $W(Q_i^{N_{max}})$ can be found in 3GPP TS38.212, chapter 5.3.1.

In one embodiment, the first sub-block is composed of S1 bit(s), the first sub-block is mapped onto a position(s) corresponding to the S1 greatest $W(Q_i^{N_{max}})$ in the first bit block.

In one embodiment, the first sub-block is composed of S1 bit(s), the first sub-block is mapped onto S1 position(s) in the first bit block corresponding to the S1 greatest index (indices) in a Polar sequence.

In one embodiment, the UE in the present disclosure assumes a probability that a receiver incorrectly decodes the first sub-block on premises of a first hypothesis is no higher than a first threshold, the first hypothesis is that the number of bits comprised in the first bit block is equal to a maximum value among the M candidate values of the present disclosure.

In one subembodiment, a target receiver of the first radio signal in the present disclosure calculates a first coding rate based on the receiver, the first coding rate is used for determining a Modulation and Coding Scheme (MCS) of the first bit block; a coding rate of the first bit block no greater than the first coding rate is one of conditions for ensuring that a probability of incorrectly decoding the first sub-block on premises of the first hypothesis is no higher than the first threshold.

In one embodiment, a target receiver of the first radio signal in the present disclosure calculates a first Signal-to-Noise Ratio (SNR) based on the receiver, the first SNR is used for determining a transmitting power of the first radio signal; an SNR of the first radio signal greater than or equal to the first SNR is one of conditions for ensuring that a probability of incorrectly decoding the first sub-block on premises of the first hypothesis is no higher than the first threshold.

In one embodiment, a target receiver of the first radio signal in the present disclosure calculates a first modulation mode based one the receiver, the first modulation mode is used for determining an MCS of the first bit block; a modulation mode for the first bit block having higher reliability than the first modulation mode is one of conditions for ensuring that a probability of incorrectly decoding the first sub-block on premises of the first hypothesis is no higher than the first threshold.

In one embodiment, the first channel coding comprises T sub-codings, the T is a positive integer greater than 1; any one of the T sub-codings is based on a polar code, an input to any of the T sub-codings comprises part of bits in the first bit block, and outputs after the T sub-codings are used for generating the K1 first sub-signal(s).

In one subembodiment of the above embodiment, there is no such bit in the first bit block belonging to inputs to multiple sub-codings of the T sub-codings at the same time.

In one subembodiment of the above embodiment, any bit in the first bit block belongs to an input to one of the T sub-codings.

In one subembodiment of the above embodiment, the K1 first sub-signal(s) is(are) an output after the outputs of the T sub-codings are sequentially subjected to concatenation, scrambling, a modulation mapper, a layer mapper, a transform precoder, precoding, a resource element mapper, multicarrier symbol generation, modulation and upconversion.

In one subembodiment of the above embodiment, the K1 first sub-signal(s) is(are) an output after the outputs of the T sub-codings are sequentially subjected to concatenation, scrambling, a modulation mapper, a layer mapper, precoding, a resource element mapper, multicarrier symbol generation, modulation and upconversion.

In one subembodiment of the above embodiment, outputs after the T sub-codings are subjected to concatenation to acquire a first reference bit block; the K1 first sub-signal(s) is(are) an output after the first reference bit block is sequentially subjected to scrambling, a modulation mapper, a layer mapper, a transform precoder, precoding, a resource element mapper, multicarrier symbol generation, modulation and upconversion.

In one subembodiment of the above embodiment, outputs after the T sub-codings are subjected to concatenation to acquire a first reference bit block; the K1 first sub-signal(s) is(are) an output after the first reference bit block is sequentially subjected to scrambling, a modulation mapper, a layer mapper, precoding, a resource element mapper, multicarrier symbol generation, modulation and upconversion.

In one subembodiment of the above embodiment, the first bit block consists of T bit sub-blocks, any of the T bit sub-blocks comprises a positive integer number of bits; inputs to the T sub-codings respectively comprise bits in the T bit sub-blocks.

In one reference embodiment of the above subembodiment, the first sub-block belongs to one of the T bit sub-blocks.

In one reference embodiment of the above subembodiment, the first sub-block is one of the T bit sub-blocks.

In one reference embodiment of the above subembodiment, the first sub-block belongs to a target bit sub-block of the T bit sub-blocks. Reliability of a sub-channel mapped by any bit in the first sub-block is greater than reliability of a sub-channel mapped by at any bit in the target bit sub-block other than the first sub-block.

In one embodiment, a channel coding corresponding to the first channel decoding in the present disclosure is the first channel coding.

In one embodiment, the first channel decoding in the present disclosure includes initial decoding and re-decoding; the base station in the present disclosure performs the initial decoding on the K1 first sub-signal(s), and recovers the first sub-block; determines the number of bits comprised in the first bit block according to a value of the first sub-block; and performs the re-decoding on the K1 first sub-signal(s) according to the number of bits comprised in the first bit block, and recovers the first bit block.

In one embodiment, the first channel decoding in the present disclosure includes initial decoding and re-decoding; the base station performs the initial decoding on K2 out of the K1 first sub-signal(s), and recovers the first sub-block; determines the K1 according to a value of the first sub-block; then performs the re-decoding on the K1 first sub-signal(s), and recovers the first bit block. The K2 first sub-signal(s) is(are) a subset of the K1 first sub-signal(s), the K2 is a positive integer no greater than the K1.

Embodiment 18

Figure 18:
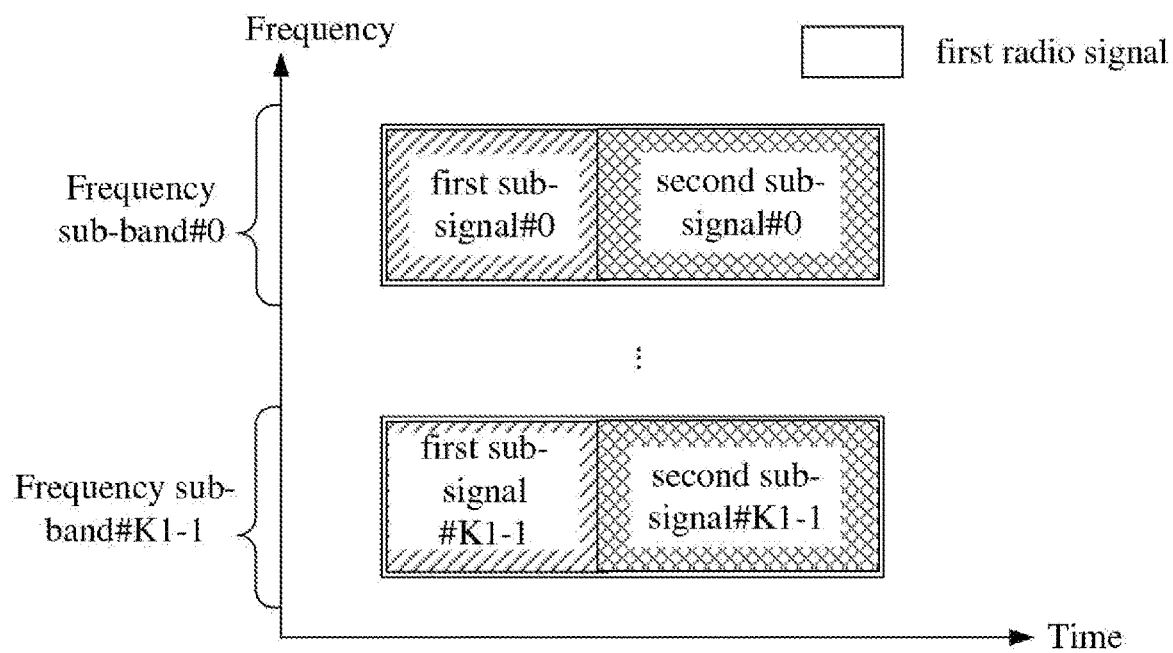
FIG. 18 illustrates a schematic diagram of resource mapping of a first radio signal, K1 first sub-signals and K1 second sub-signals onto K1 frequency sub-bands according to one embodiment of the present disclosure.

Embodiment 18 illustrates a schematic diagram of resource mapping of a first radio signal, K1 first sub-signals and K1 second sub-signals onto K1 frequency sub-bands; as shown in FIG. 18.

In Embodiment 18, the first radio signal comprises the K1 first sub-signals and the K1 second sub-signals. The K1 first sub-signals are transmitted respectively on the K1 frequency sub-bands; the K1 second sub-signals are transmitted respectively on the K1 frequency sub-bands. Each of the K1 first sub-signals carries the first bit block in the present disclosure, each of the K1 second sub-signals carries the second bit block in the present disclosure. In FIG. 18, indices of the K1 first sub-signals, the K1 second sub-signals and the K1 frequency sub-bands are #0, . . . , #K1−1, respectively. A box marked with thick solid lines represents the first radio signal, boxes filled with slashes represent the K1 first sub-signals, and boxes filled with crosses represent the K1 second sub-signals.

In one embodiment, the second bit block comprises uplink data.

In one embodiment, the second bit block is a Transport Block (TB), wherein a TB comprises a positive integer number of bits.

In one embodiment, the phrase that each of the K1 second sub-signals carries the second bit block means that the K1 second sub-signals are an output after all or part of bits comprised in the second bit block are sequentially subjected to part of or all processes of CRC Attachment, Segmentation, coding block-level CRC Attachment, Channel Coding, Rate Matching, Concatenation, Scrambling, a Modulation Mapper, a Layer Mapper, Precoding, a Resource Element Mapper, Multicarrier Symbol Generation, and Modulation and Upconversion.

In one embodiment, the phrase that each of the K1 second sub-signals carries the second bit block means that the second bit block is used for generating each second sub-signal of the K1 second sub-signals.

In one embodiment, the K1 second sub-signals correspond to a same HARQ process.

In one embodiment, a channel coding for the second bit block is based on a Low Density Parity Check (LDPC) code; the specific meaning and implementation method of the LDPC code can be found in 3GPP TS38.212, chapter 5.3.2.

In one embodiment, the first bit block and the second bit block correspond to different channel codings.

In one embodiment, the first bit block and the second bit block correspond to separate channel codings.

one embodiment, the first bit block and the second bit block respectively belong to inputs to different channel codings.

Embodiment 19

Figure 19:
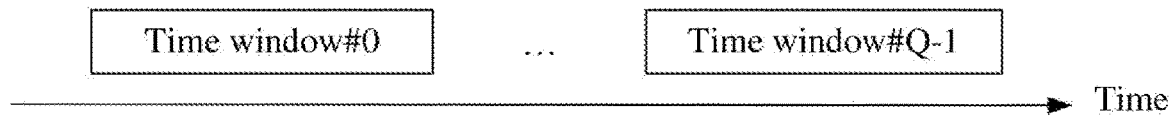
FIG. 19 illustrates a schematic diagram of Q time windows according to one embodiment of the present disclosure.

Embodiment 19 illustrates a schematic diagram of Q time windows; as shown in FIG. 19.

In Embodiment 19, the first information in the present disclosure is used for determining the Q time windows, the time domain resource occupied by the first radio signal in the present disclosure belongs to a first time window of the Q time windows; the Q is a positive integer greater than 1. In FIG. 19, indices for the Q time windows are #0, . . . , #Q−1, respectively.

In one embodiment, the first information indicates the Q time windows.

In one embodiment, the first information explicitly indicates the Q time windows.

In one embodiment, the first information and the first signaling of the present disclosure jointly indicate the Q time windows.

In one embodiment, the first time window is one of the Q time windows.

In one embodiment, any two of the Q time windows are orthogonal (non-overlapping).

In one embodiment, the Q time windows are non-consecutive in time domain.

In one embodiment, at least two of the Q time windows are consecutive in time domain.

In one embodiment, any two of the Q time windows are of equal length.

In one embodiment, at least two of the Q time windows have different lengths.

In one embodiment, the Q time windows occur with equal time intervals in time domain.

In one embodiment, the Q time windows occur with unequal time intervals in time domain.

In one embodiment, any of the Q time windows is a continuous period.

In one embodiment, any of the Q time windows is a slot.

In one embodiment, any of the Q time windows is a subframe.

In one embodiment, any of the Q time windows comprises a positive integer number of multicarrier symbol(s).

In one embodiment, any of the Q time windows comprises a positive integer number of consecutive multicarrier symbols.

In one embodiment, any of the Q time windows comprises a positive integer number of slot(s).

In one embodiment, any of the Q time windows comprises a positive integer number of consecutive slots.

In one embodiment, any of the Q time windows comprises a positive integer number of subframes.

In one embodiment, any of the Q time windows comprises a positive integer number of consecutive subframes.

In one embodiment, each of the Q time windows belongs to time domain resources allocated to AUL-based uplink transmission.

In one embodiment, each of the Q time windows belongs to time domain resources allocated to configured grant-based uplink transmission.

Embodiment 20

Figure 20:
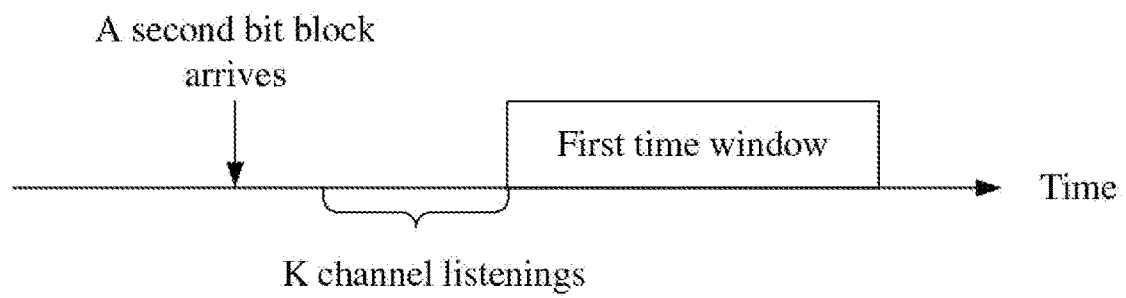
FIG. 20 illustrates a schematic diagram illustrating a UE spontaneously choosing a first time window from Q time windows according to one embodiment of the present disclosure.

Embodiment 20 illustrates a schematic diagram illustrating a UE spontaneously choosing a first time window from Q time windows; as shown in FIG. 20.

In Embodiment 20, the first radio signal in the present disclosure is transmitted within the first time window. The first radio signal carries the second bit block in the present disclosure. A start time for the first time window is later than an arriving time of the second bit block. The K channel listenings in the present disclosure are used for choosing the first time window from the Q time windows.

In one embodiment, a start time for the first time window is later than an arriving time of the second bit block.

In one embodiment, a start time for the first time window is later than a time when the second bit block arrives at the physical layer of the UE.

In one embodiment, the K channel listenings are used by the UE for choosing the first time window from the Q time windows.

In one embodiment, the first time window is an earliest time window among the Q time windows whose start time is later than the arriving time of the second bit block and determined based on the K channel listenings that at least one of the K frequency sub-bands in the present disclosure is idle.

In one embodiment, any of the K1 frequency sub-band(s) in the present disclosure is determined as idle in the first time window by a corresponding channel listening of the K channel listenings.

In one embodiment, any of the K1 frequency sub-band(s) in the present disclosure is determined as able to transmit radio signal(s) in the first time window by a corresponding channel listening of the K channel listenings.

In one embodiment, any of the K1 frequency sub-band(s) in the present disclosure is determined as able to be used by the UE for transmitting radio signal(s) in the first time window by a corresponding channel listening of the K channel listenings.

In one embodiment, any of the K1 frequency sub-band(s) in the present disclosure is determined as able to transmit the first radio signal in the first time window by a corresponding channel listening of the K channel listenings.

In one embodiment, any of the K frequency sub-channels other than the K1 frequency sub-channel(s) in the present disclosure is determined as busy in the first time window by a corresponding channel listening of the K channel listenings.

In one embodiment, any of the K frequency sub-channels other than the K1 frequency sub-channel(s) in the present disclosure is determined as unable to transmit radio signal in the first time window by a corresponding channel listening of the K channel listenings.

In one embodiment, at least one of the K frequency sub-channels other than the K1 frequency sub-channel(s) in the present disclosure is determined as idle in the first time window by a corresponding channel listening of the K channel listenings.

In one embodiment, at least one of the K frequency sub-channels other than the K1 frequency sub-channel(s) in the present disclosure is determined as able to transmit radio signal(s) in the first time window by a corresponding channel listening of the K channel listenings.

In one embodiment, the UE in the present disclosure does not transmit any radio signal on any one of the K frequency sub-bands not belonging to the K1 frequency sub-bands of the present disclosure in the first time window.

In one embodiment, the first radio signal occupies all time domain resources within the first time window.

In one embodiment, the first radio signal only occupies part of time domain resources within the first time window.

In one embodiment, the first radio signal occupies a first multicarrier symbol in the first time window.

In one embodiment, the first radio signal does not occupy a first multicarrier symbol in the first time window.

In one embodiment, the first radio signal occupies a last multicarrier symbol in the first time window.

In one embodiment, the first radio signal does not occupy a last multicarrier symbol in the first time window Embodiment 21

Figure 21:
FIG. 21 illustrates a schematic diagram of first information according to one embodiment of the present disclosure.

Embodiment 21 illustrates a schematic diagram of first information; as shown in FIG. 21.

In Embodiment 21, the first information comprises a first bit string, the first bit string consists of a positive integer number of bit(s), the first bit string indicates the Q time windows of the present disclosure.

In one embodiment, the first information is carried by a higher layer signaling.

In one embodiment, the first information is carried by an RRC signaling.

In one embodiment, the first information is an Information Element (IE).

In one embodiment, the first information comprises an IE.

In one embodiment, the first information comprises all or part of information in an IE.

In one embodiment, the first information comprises all or part of information in a ConfiguredGrantConfig IE.

In one subembodiment, the specific meaning of ConfiguredGrantConfig IE can be found in 3GPP TS38.311.

In one embodiment, the first information comprises all or part of information in an SPS-Config IE.

In one subembodiment, the specific meaning of SPS-Config IE can be found in 3GPP TS38.311.

In one embodiment, the first bit string is composed of 40 bits.

In one embodiment, the Q time windows are a subset of Q1 time windows, the Q1 is a positive integer no less than Q. The first bit block comprises Q1 bits, the Q1 bits respectively correspond to the Q1 time windows. For any given bit in the first bit string, if the given bit is equal to a given value, a time window corresponding to the given bit out of the Q1 time windows is one of the Q time windows; or if the given bit is not equal to a given value, a time window corresponding to the given bit out of the Q1 time windows is not one of the Q time windows.

In one subembodiment of the above embodiment, the given value is 1.

In one subembodiment of the above embodiment, the given value is 0.

In one embodiment, the first information indicates the M candidate values of the present disclosure.

In one embodiment, the first information indicates a relation between the number of bits comprised in the first bit block and the K1 of the present disclosure.

In one embodiment, the first information is transmitted in one or more frequency sub-bands out of the K frequency sub-bands.

In one embodiment, the first information is transmitted in a frequency band other than the K frequency sub-bands of the present disclosure.

In one embodiment, the first information is transmitted in a frequency band deployed on unlicensed spectrum.

In one embodiment, the first information is transmitted in a frequency band deployed on licensed spectrum.

Embodiment 22

Figure 22:
FIG. 22 illustrates a schematic diagram of first information according to one embodiment of the present disclosure.

Embodiment 22 illustrates a schematic diagram of first information; as shown in FIG. 22.

In Embodiment 22, the first information comprises a first field, the first field of the first information is used for determining the Q time windows of the present disclosure.

In one embodiment, the first field of the first information indicates the Q time windows.

In one embodiment, the first field of the first information explicitly indicates the Q time windows.

In one embodiment, the first field of the first information comprises all or part of information in a periodicity field of a ConfiguredGrantConfig IE.

In one embodiment, the first field of the first information comprises all or part of information in a timeDomainOffset field of a ConfiguredGrantConfig IE.

In one embodiment, the first field of the first information comprises all or part of information in a timeDomainAllocation field of a ConfiguredGrantConfig IE.

In one embodiment, the first field of the first information comprises all or part of information in a periodicity field of an SPS-Config IE.

In one embodiment, the specific meaning of the periodicity field of the ConfiguredGrantConfig IE can be found in 3GPP TS38.311.

In one embodiment, the specific meaning of the timeDomainOffset field of the ConfiguredGrantConfig IE can be found in 3GPP TS38.311.

In one embodiment, the specific meaning of the timeDomainAllocation field of the ConfiguredGrantConfig IE can be found in 3GPP TS38.311.

Embodiment 23

Figure 23:
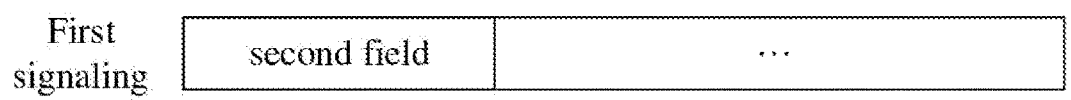
FIG. 23 illustrates a schematic diagram of a first signaling according to one embodiment of the present disclosure.

Embodiment 23 illustrates a schematic diagram of a first signaling; as shown in FIG. 23.

In Embodiment 23, the first signaling comprises a second field, the second field of the first signaling indicates a frequency domain resource occupied by the first radio signal in the present disclosure.

In one embodiment, the first signaling explicitly indicates a frequency domain resource occupied by the first radio signal.

In one embodiment, the first signaling is a physical layer signaling.

In one embodiment, the first signaling is a dynamic signaling.

In one embodiment, the first signaling is a Layer 1 (L1) signaling.

In one embodiment, the first signaling is a Layer 1 (L1) control signaling.

In one embodiment, the first signaling comprises Downlink Control Information (DCI).

In one embodiment, the first signaling is UE-specific.

In one embodiment, the first signaling is cell-common.

In one embodiment, the first signaling is specific to a terminal group, wherein the terminal group comprises a positive integer number of terminal(s), the UE in the present disclosure is a terminal of the terminal group.

In one embodiment, a signaling identifier of the first signaling is a Configured Scheduling-Radio Network Temporary Identifier (CS-RNTI).

In one embodiment, the first signaling comprises DCI with CRC scrambled by CS-RNTI.

In one embodiment, a signaling identifier of the first signaling is a Semi-Persistent Scheduling-Cell-RNTI (SPS-C-RNTI).

In one embodiment, the first signaling comprises DCI with CRC scrambled by SPS-C-RNTI.

In one embodiment, the first signaling is used for AUL activation.

In one embodiment, the first signaling is used for activating uplink transmission based on Type 2 configured grant.

In one embodiment, the first signaling is used for activating the Q time windows in the present disclosure.

In one embodiment, a HARQ process number field of the first signaling is configured as all 0.

In one embodiment, a Redundancy version field of the first signaling is configured as all 0.

In one embodiment, the first signaling includes a dynamic signaling used for UpLink Grant.

In one embodiment, the first signaling is a dynamic signaling used for UpLink Grant.

In one embodiment, a signaling identifier of the first signaling is a C-RNTI.

In one embodiment, the first signaling comprises DCI with CRC scrambled by C-RNTI.

In one embodiment, the first signaling indicates scheduling information of the first radio signal.

In one embodiment, scheduling information of the first radio signal comprises at least one of occupied time domain resource, occupied frequency domain resource, an MCS, configuration information of DMRS, a HARQ process, a Redundancy Version (RV), or a New Data Indicator (NDI).

In one subembodiment, the configuration information of DMRS comprises one or more of occupied time domain resource, occupied frequency domain resource, occupied code domain resource, an RS sequence, a mapping mode, a DMRS type, cyclic shift (CP), or an Orthogonal Cover Code (OCC).

In one embodiment, the first signaling indicates the time domain resource occupied by the first radio signal.

In one embodiment, a HARQ process number field of the first signaling is not all 0.

In one embodiment, a Redundancy version field of the first signaling is not all 0.

In one embodiment, the second field of the first signaling comprises all or part of information comprised in a Frequency domain resource assignment field.

In one embodiment, the second field of the first signaling comprises all or part of information comprised in a Carrier indicator field.

In one embodiment, the second field of the first signaling comprises all or part of information comprised in a Bandwidth part indicator field.

In one embodiment, the specific meaning of the Frequency domain resource assignment field can be found in 3GPP TS38.212.

In one embodiment, the specific meaning of the Carrier indicator field can be found in 3GPP TS38.212.

In one embodiment, the specific meaning of the Bandwidth part indicator field can be found in 3GPP TS38.212.

In one embodiment, the first signaling is transmitted in one or more frequency sub-bands of the K frequency sub-bands in the present disclosure.

In one embodiment, the first signaling is transmitted in a frequency band other than the K frequency sub-bands in the present disclosure.

In one embodiment, the first signaling is transmitted in a frequency band deployed on unlicensed spectrum.

In one embodiment, the first signaling is transmitted in a frequency band deployed on licensed spectrum.

Embodiment 24

Figure 24:
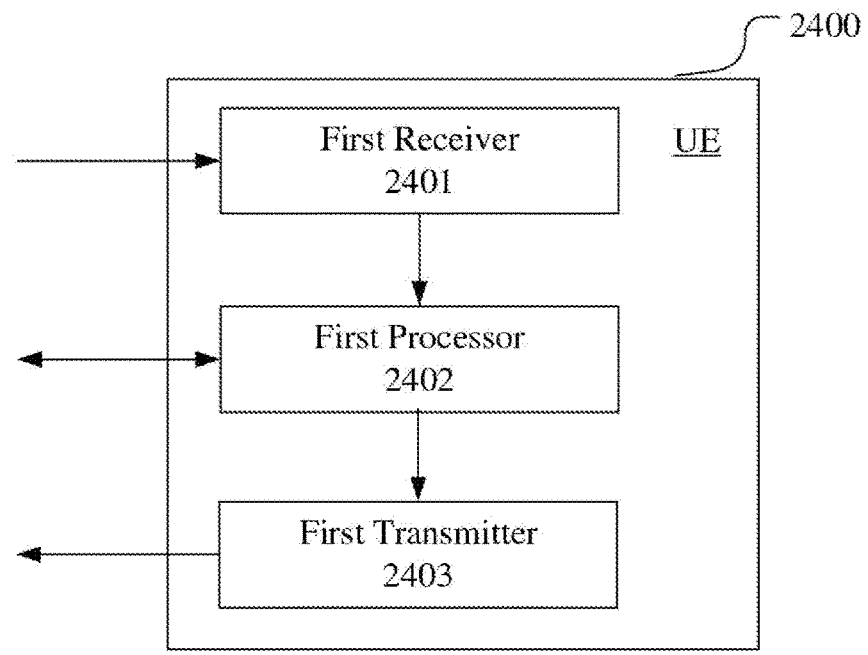
FIG. 24 illustrates a structure block diagram of a processing device in a UE according to one embodiment of the present disclosure.

Embodiment 24 illustrates a structure block diagram of a processing device in a UE; as shown in FIG. 24. In FIG. 24, a processing device 2400 in the UE consists of a first receiver 2401, a first processor 2402 and a first transmitter 2403.

In Embodiment 24, the first receiver 2401 performs K channel listenings respectively in K frequency sub-bands; the first processor 2402 determines that a first radio signal only can be transmitted in K1 out of the K frequency sub-bands; the first transmitter 2403 transmits the first radio signal on the K1 frequency sub-band(s).

In Embodiment 24, the K channel listenings are used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the number of REs occupied by any of the K1 first sub-signal(s) in time-frequency domain is unrelated to the K1.

In one embodiment, the number of bits comprised in the first bit block is a candidate value of M candidate values, the M is a positive integer greater than 1, the M candidate values are positive integers respectively.

In one embodiment, the first bit block comprises a first sub-block, the first sub-block comprises a positive integer number of bits; the first sub-block indicates the number of bits comprised in the first bit block.

In one embodiment, the position of the first sub-block in the first bit block is determined by default.

In one embodiment, the first transmitter 2403 performs a first channel coding; wherein the first channel coding is based on a polar code; an input to the first channel coding comprises the first bit block, an output after the first channel coding is used for generating the K1 first sub-signal(s); reliability of a sub-channel mapped by a bit in the first sub-block is greater than reliability of a sub-channel mapped by a bit in the first bit block other than the first sub-block.

In one embodiment, the first radio signal comprises K1 second sub-signal(s), the K1 second sub-signal(s) is(are) respectively transmitted in the K1 frequency sub-band(s); each of the K1 second sub-signal(s) carries a second bit block, the second bit block comprises a positive integer number of bits.

In one embodiment, the first receiver 2401 receives first information; wherein the first information is used for determining Q time windows, a time domain resource occupied by the first radio signal belongs to a first time window of the Q time windows; the Q is a positive integer greater than 1.

In one embodiment, the first processor 2402 spontaneously chooses the first time window from the Q time windows.

In one embodiment, the first receiver 2401 receives a first signaling; wherein the first signaling indicates a frequency domain resource occupied by the first radio signal.

In one embodiment, the first receiver 2401 comprises at least one of the antenna 452, the receiver 454, the receiving processor 456, the channel decoder 458, the controller/processor 459, the memory 460 or the data source 467 in Embodiment 4.

In one embodiment, the first processor 2402 comprises at least one of the antenna 452, the transmitter/receiver 454, the transmitting processor 468, the receiving processor 456, the channel encoder 457, the channel decoder 458, the controller/processor 459, the memory 460 or the data source 467 in Embodiment 4.

In one embodiment, the first transmitter 2403 comprises at least one of the antenna 452, the transmitter 454, the transmitting processor 468, the channel encoder 457, the controller/processor 459, the memory 460 or the data source 467 in Embodiment 4.

Embodiment 25

Figure 25:
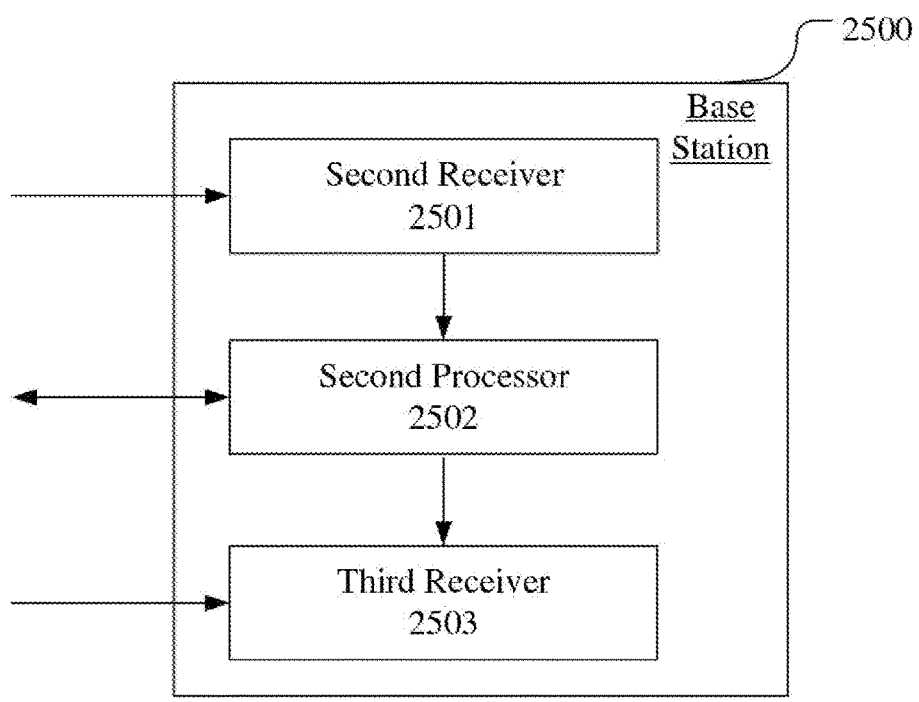
FIG. 25 illustrates a structure block diagram of a processing device in a base station according to one embodiment of the present disclosure.

Embodiment 25 illustrates a structure block diagram of a processing device in a base station; as shown in FIG. 25. In FIG. 25, a processing device 2500 in a base station consists a second receiver 2501, a second processor 2502 and a third receiver 2503.

In Embodiment 25, the second receiver 2501 monitors a first radio signal respectively in K frequency sub-bands; the second processor 2502 determines that the first radio signal only needs to be received in K1 out of the K frequency sub-bands; the third receiver 2503 receives the first radio signal on the K1 frequency sub-band(s).

In Embodiment 25, the monitoring action is used for determining the K1 frequency sub-band(s) out of the K frequency sub-bands; the first radio signal comprises K1 first sub-signal(s), the K1 first sub-signal(s) is(are) respectively transmitted in the K1 frequency sub-band(s); each of the K1 first sub-signal(s) carries a first bit block, the first bit block comprises a positive integer number of bits, and the number of bits comprised in the first bit block is related to the K1; the K is a positive integer, the K1 is a positive integer not greater than the K.

In one embodiment, the number of REs occupied by any of the K1 first sub-signal(s) in time-frequency domain is unrelated to the K1.

In one embodiment, the number of bits comprised in the first bit block is a candidate value of M candidate values, the M is a positive integer greater than 1, the M candidate values are positive integers respectively.

In one embodiment, the first bit block comprises a first sub-block, the first sub-block comprises a positive integer number of bits; the first sub-block indicates the number of bits comprised in the first bit block.

In one embodiment, the position of the first sub-block in the first bit block is determined by default.

In one embodiment, the third receiver 2503 performs a first channel decoding; wherein a channel coding corresponding to the first channel decoding is a first channel coding, the first channel coding is based on a polar code; an input to the first channel coding comprises the first bit block, an output after the first channel coding is used for generating the K1 first sub-signal(s); an output after the first channel decoding is used for recovering the first bit block; reliability of a sub-channel mapped by a bit in the first sub-block is greater than reliability of a sub-channel mapped by a bit in the first bit block other than the first sub-block.

In one embodiment, the first radio signal comprises K1 second sub-signal(s), the K1 second sub-signal(s) is(are) respectively transmitted in the K1 frequency sub-band(s); each of the K1 second sub-signal(s) carries a second bit block, the second bit block comprises a positive integer number of bits.

In one embodiment, the second processor 2502 transmits first information; wherein the first information is used for determining Q time windows, a time domain resource occupied by the first radio signal belongs to a first time window of the Q time windows; the Q is a positive integer greater than 1.

In one embodiment, the monitoring action is used for the first time window out of the Q time windows.

In one embodiment, the second processor 2502 transmits a first signaling; wherein the first signaling indicates a frequency domain resource occupied by the first radio signal.

In one embodiment, the second receiver 2501 comprises at least one of the antenna 420, the receiving processor 418, the receiving processor 470, the channel decoder 478, the controller/processor 475 or the memory 476 in Embodiment 4.

In one embodiment, the second processor 2502 comprises at least one of the antenna 420, the transmitter/receiver 418, the transmitting processor 416, the receiving processor 470, the channel encoder 477, the channel decoder 478, the controller/processor 475 or the memory 476 in Embodiment 4.

In one embodiment, the third receiver 2503 comprises at least one of the antenna 420, the receiver 418, the receiving processor 470, the channel decoder 478, the controller/processor 475 or the memory 476 in Embodiment 4.

The ordinary skill in the art may understand that all or part of steps in the above method may be implemented by instructing related hardware through a program. The program may be stored in a computer readable storage medium, for example Read-Only-Memory (ROM), hard disk or compact disc, etc. Optionally, all or part of steps in the above embodiments also may be implemented by one or more integrated circuits. Correspondingly, each module unit in the above embodiment may be implemented in the form of hardware, or in the form of software function modules. The present disclosure is not limited to any combination of hardware and software in specific forms. The UE and terminal in the present disclosure include but are not limited to unmanned aerial vehicles, communication modules on unmanned aerial vehicles, telecontrolled aircrafts, aircrafts, diminutive airplanes, mobile phones, tablet computers, notebooks, vehicle-mounted communication equipment, wireless sensor, network cards, terminals for Internet of Things (IOT), RFID terminals, NB-IOT terminals, Machine Type Communication (MTC) terminals, enhanced MTC (eMTC) terminals, data cards, low-cost mobile phones, low-cost tablet computers, etc. The base station or system device in the present disclosure includes but is not limited to macro-cellular base stations, micro-cellular base stations, home base stations, relay base station, gNB (NR node B), Transmitter Receiver Point (TRP), and other radio communication equipment.

The above are merely the preferred embodiments of the present disclosure and are not intended to limit the scope of protection of the present disclosure. Any modification, equivalent substitute and improvement made within the spirit and principle of the present disclosure are intended to be included within the scope of protection of the present disclosure

What is claimed is:

1. A method in a User Equipment (UE) used for wireless communication, comprising:
    performing K channel listenings respectively in K frequency sub-bands;
    determining that a first radio signal can only be transmitted in K1 frequency sub-band(s) out of the K frequency sub-bands; and
    transmitting the first radio signal in the K1 frequency sub-band(s);
    wherein:
        the K channel listenings are used for determining the K1 frequency sub-band(s) out of the K frequency sub-bands;
        the first radio signal comprises K1 first sub-signal(s), and the K1 first sub-signal(s) is(are) respectively transmitted in the K1 frequency sub-band(s);
        each of the K1 first sub-signal(s) carries a first bit block, the first bit block comprises a positive integer number of bits, and the number of bits comprised in the first bit block is related to the K1;
        the K is a positive integer, and the K1 is a positive integer not greater than the K; and
        the first radio signal comprises K1 second sub-signal(s), the K1 second sub-signal(s) is(are) respectively transmitted in the K1 frequency sub-band(s), each of the K1 second sub-signal(s) carries a second bit block, and the second bit block comprises a positive integer number of bits.

2. The method according to claim 1, wherein:
    a number of REs occupied by any of the K1 first sub-signal(s) in time-frequency domain is unrelated to the K1; or
    the number of bits comprised in the first bit block is a candidate value of M candidate values, the M is a positive integer greater than 1, and the M candidate values are positive integers respectively.

3. The method according to claim 1, wherein the first bit block comprises a first sub-block, the first sub-block comprises a positive integer number of bit(s), the first sub-block indicates the number of bits comprised in the first bit block;
    or, the first bit block comprises a first sub-block, the first sub-block comprises a positive integer number of bit(s), the first sub-block indicates the number of bits comprised in the first bit block, and a position of the first sub-block in the first bit block is determined by default;
    or, comprising:
    performing a first channel coding,
    wherein the first bit block comprises a first sub-block, the first sub-block comprises a positive integer number of bit(s), the first sub-block indicates the number of bits comprised in the first bit block, the first channel coding is based on a polar code, an input to the first channel coding comprises the first bit block, an output after the first channel coding is used for generating the K1 first sub-signal(s), and reliability of a sub-channel mapped by a bit in the first sub-block is greater than reliability of a sub-channel mapped by a bit in the first bit block other than the first sub-block.

4. The method according to claim 1, further comprising:
    receiving a first signaling,
    wherein the first signaling indicates a frequency domain resource occupied by the first radio signal.

5. The method according to claim 1, comprising:
    receiving first information,
    wherein the first information is used for determining Q time windows, a time domain resource occupied by the first radio signal belongs to a first time window of the Q time windows, and the Q is a positive integer greater than 1;
    or, comprising:
    receiving first information, and
    spontaneously choosing a first time window from Q time windows,
    wherein the first information is used for determining the Q time windows, a time domain resource occupied by the first radio signal belongs to the first time window of the Q time windows, and the Q is a positive integer greater than 1.

6. A method in a base station used for wireless communication, comprising:
    monitoring a first radio signal respectively in K frequency sub-bands;
    determining that the first radio signal only needs to be received in K1 frequency sub-band(s) out of the K frequency sub-bands; and
    receiving the first radio signal in the K1 frequency sub-band(s);
    wherein:
        the monitoring action is used for determining the K1 frequency sub-band(s) out of the K frequency sub-bands;
        the first radio signal comprises K1 first sub-signal(s), and the K1 first sub-signal(s) is(are) respectively transmitted in the K1 frequency sub-band(s);
        each of the K1 first sub-signal(s) carries a first bit block, the first bit block comprises a positive integer number of bits, and the number of bits comprised in the first bit block is related to the K1; and
        the K is a positive integer, and the K1 is a positive integer not greater than the K.

7. The method according to claim 6, wherein:
    a number of REs occupied by any of the K1 first sub-signal(s) in time-frequency domain is unrelated to the K1; or
    the number of bits comprised in the first bit block is a candidate value of M candidate values, the M is a positive integer greater than 1, and the M candidate values are positive integers respectively.

8. The method according to claim 6, wherein the first bit block comprises a first sub-block, the first sub-block comprises a positive integer number of bit(s), the first sub-block indicates the number of bits comprised in the first bit block;

or, the first bit block comprises a first sub-block, the first sub-block comprises a positive integer number of bit(s), the first sub-block indicates the number of bits comprised in the first bit block, and a position of the first sub-block in the first bit block is determined by default;

or, comprising:
performing a first channel decoding,
wherein the first bit block comprises a first sub-block, the first sub-block comprises a positive integer number of bit(s), the first sub-block indicates the number of bits comprised in the first bit block, a channel coding corresponding to the first channel decoding is a first channel coding, the first channel coding is based on a polar code, an input to the first channel coding comprises the first bit block, an output after the first channel coding is used for generating the K1 first sub-signal(s), an output after the first channel decoding is used for recovering the first bit block, and reliability of a sub-channel mapped by a bit in the first sub-block is greater than reliability of a sub-channel mapped by a bit in the first bit block other than the first sub-block.

9. The method according to claim 6, wherein the first radio signal comprises K1 second sub-signal(s), the K1 second sub-signal(s) is(are) respectively transmitted in the K1 frequency sub-band(s), each of the K1 second sub-signal(s) carries a second bit block, and the second bit block comprises a positive integer number of bits;

or, comprising:
transmitting a first signaling,
wherein the first signaling indicates a frequency domain resource occupied by the first radio signal.

10. The method according to claim 6, comprising:
transmitting first information,
wherein the first information is used for determining Q time windows, a time domain resource occupied by the first radio signal belongs to a first time window of the Q time windows, and the Q is a positive integer greater than 1;

or, comprising:
transmitting first information,
wherein the first information is used for determining Q time windows, a time domain resource occupied by the first radio signal belongs to a first time window of the Q time windows, the Q is a positive integer greater than 1, and the monitoring action is used for determining the first time window out of the Q time windows.

11. A UE used for wireless communication, comprising:
a first receiver, performing K channel listenings respectively in K frequency sub-bands;
a first processor, determining that a first radio signal can only be transmitted in K1 frequency sub-band(s) out of the K frequency sub-bands; and
a first transmitter, transmitting the first radio signal in the K1 frequency sub-band(s);
wherein:
the K channel listenings are used for determining the K1 frequency sub-band(s) out of the K frequency sub-bands;
the first radio signal comprises K1 first sub-signal(s), and the K1 first sub-signal(s) is(are) respectively transmitted in the K1 frequency sub-band(s);
each of the K1 first sub-signal(s) carries a first bit block, the first bit block comprises a positive integer number of bits, and the number of bits comprised in the first bit block is related to the K1;
the K is a positive integer, and the K1 is a positive integer not greater than the K; and
the first radio signal comprises K1 second sub-signal(s), the K1 second sub-signal(s) is(are) respectively transmitted in the K1 frequency sub-band(s), each of the K1 second sub-signal(s) carries a second bit block, and the second bit block comprises a positive integer number of bits.

12. The UE according to claim 11, wherein:
a number of REs occupied by any of the K1 first sub-signal(s) in time-frequency domain is unrelated to the K1; or
the number of bits comprised in the first bit block is a candidate value of M candidate values, the M is a positive integer greater than 1, and the M candidate values are positive integers respectively.

13. The UE according to claim 11, wherein:
the first bit block comprises a first sub-block, the first sub-block comprises a positive integer number of bit(s), and the first sub-block indicates the number of bits comprised in the first bit block; or
the first bit block comprises a first sub-block, the first sub-block comprises a positive integer number of bit(s), the first sub-block indicates the number of bits comprised in the first bit block, and a position of the first sub-block in the first bit block is determined by default; or
the first transmitter performs a first channel coding, wherein the first bit block comprises a first sub-block, the first sub-block comprises a positive integer number of bit(s), the first sub-block indicates the number of bits comprised in the first bit block, the first channel coding is based on a polar code, an input to the first channel coding comprises the first bit block, an output after the first channel coding is used for generating the K1 first sub-signal(s), and reliability of a sub-channel mapped by a bit in the first sub-block is greater than reliability of a sub-channel mapped by a bit in the first bit block other than the first sub-block.

14. The UE according to claim 11, wherein the first receiver receives a first signaling, wherein the first signaling indicates a frequency domain resource occupied by the first radio signal.

15. The UE according to claim 11, wherein:
the first receiver receives first information, wherein the first information is used for determining Q time windows, a time domain resource occupied by the first radio signal belongs to a first time window of the Q time windows, and the Q is a positive integer greater than 1; or
the first receiver receives first information, the first processor chooses a first time window from Q time windows, wherein the first information is used for determining the Q time windows, a time domain resource occupied by the first radio signal belongs to the first time window of the Q time windows, and the Q is a positive integer greater than 1.

16. A base station used for wireless communication, comprising:
a second receiver, monitoring a first radio signal respectively in K frequency sub-bands;
a second processor, determining that the first radio signal only needs to be received in K1 frequency sub-band(s) out of the K frequency sub-bands; and
a third receiver, receiving the first radio signal in the K1 frequency sub-band(s);

wherein:
- the monitoring action is used for determining the K1 frequency sub-band(s) out of the K frequency sub-bands;
- the first radio signal comprises K1 first sub-signal(s), and the K1 first sub-signal(s) is(are) respectively transmitted in the K1 frequency sub-band(s);
- each of the K1 first sub-signal(s) carries a first bit block, the first bit block comprises a positive integer number of bits, and the number of bits comprised in the first bit block is related to the K1; and
- the K is a positive integer, and the K1 is a positive integer not greater than the K.

17. The base station according to claim 16, wherein:
- a number of REs occupied by any of the K1 first sub-signal(s) in time-frequency domain is unrelated to the K1; or
- the number of bits comprised in the first bit block is a candidate value of M candidate values, the M is a positive integer greater than 1, and the M candidate values are positive integers respectively.

18. The base station according to claim 16, wherein:
- the first bit block comprises a first sub-block, the first sub-block comprises a positive integer number of bit(s), and the first sub-block indicates the number of bits comprised in the first bit block; or
- the first bit block comprises a first sub-block, the first sub-block comprises a positive integer number of bit(s), the first sub-block indicates the number of bits comprised in the first bit block, and a position of the first sub-block in the first bit block is determined by default; or
- the third receiver performs a first channel decoding, wherein the first bit block comprises a first sub-block, the first sub-block comprises a positive integer number of bit(s), the first sub-block indicates the number of bits comprised in the first bit block, a channel coding corresponding to the first channel decoding is a first channel coding, the first channel coding is based on a polar code, an input to the first channel coding comprises the first bit block, an output after the first channel coding is used for generating the K1 first sub-signal(s), an output after the first channel decoding is used for recovering the first bit block, and reliability of a sub-channel mapped by a bit in the first sub-block is greater than reliability of a sub-channel mapped by a bit in the first bit block other than the first sub-block.

19. The base station according to claim 16, wherein:
the first radio signal comprises K1 second sub-signal(s), the K1 second sub-signal(s) is(are) respectively transmitted in the K1 frequency sub-band(s), each of the K1 second sub-signal(s) carries a second bit block, and the second bit block comprises a positive integer number of bits; or
the second processor transmits a first signaling, wherein the first signaling indicates a frequency domain resource occupied by the first radio signal.

20. The base station according to claim 16, wherein:
the second processor transmits first information, wherein the first information is used for determining Q time windows, a time domain resource occupied by the first radio signal belongs to a first time window of the Q time windows, and the Q is a positive integer greater than 1; or
the second processor transmits first information, wherein the first information is used for determining Q time windows, a time domain resource occupied by the first radio signal belongs to a first time window of the Q time windows, the Q is a positive integer greater than 1, and the monitoring action is used for determining the first time window out of the Q time windows.

\* \* \* \* \*